US012399814B2

(12) United States Patent
Linnen et al.

(10) Patent No.: US 12,399,814 B2
(45) Date of Patent: Aug. 26, 2025

(54) DATA STORAGE DEVICE CONFIGURED FOR USE WITH A GENERATIVE-ADVERSARIAL-NETWORK (GAN)

(71) Applicant: Western Digital Technologies, Inc., San Jose, CA (US)

(72) Inventors: Daniel Joseph Linnen, Limestone, TN (US); William Bernard Boyle, Lake Forest, CA (US); Ariel Navon, Revava (IL); Shay Benisty, Beer Sheva (IL); Alexander Bazarsky, Holon (IL)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/232,155

(22) Filed: Aug. 9, 2023

(65) Prior Publication Data
US 2024/0338312 A1 Oct. 10, 2024

Related U.S. Application Data

(60) Provisional application No. 63/457,951, filed on Apr. 7, 2023.

(51) Int. Cl.
G06F 12/02 (2006.01)
G06N 3/0455 (2023.01)

(52) U.S. Cl.
CPC ....... *G06F 12/0246* (2013.01); *G06N 3/0455* (2023.01)

(58) Field of Classification Search
CPC ............ G06F 12/0246; G06F 11/1008; G06F 11/1012; G06F 11/1048; G06F 2212/1016;

(Continued)

(56) References Cited

U.S. PATENT DOCUMENTS 6,963,369 B1 * 11/2005 Olding ................ H04N 25/616
348/241
10,554,227 B2 2/2020 Sharon et al.
(Continued)

FOREIGN PATENT DOCUMENTS

| CN | 111986079 A | 11/2020 |
| KR | 20220004476 A | 1/2022 |
| WO | 2020256787 A1 | 12/2020 |

OTHER PUBLICATIONS

Kyle Dunphy, Data Augmentation for Deep-Learning-Based Multiclass Structural Damage Detection Using Limited Information, Aug. 2022, Sensors, vol. 22, Issue 16, pp. 3-5, 13-15, 19 (Year: 2022).*
(Continued)

*Primary Examiner* — Hosain T Alam
*Assistant Examiner* — Alan Otto
(74) *Attorney, Agent, or Firm* — LOZA & LOZA, LLP; Gabriel Fitch

(57) ABSTRACT

Data storage devices configured to exploit generative-adversarial-networks (GANs). The GANs include super-resolution GANs (SRGANs). In some examples, a GAN-based reconstruction procedure is implemented within a data storage controller to replace or supplement an error correction coding (ECC) decoding procedure. In other examples, soft bit information is exploited using GANs during decoding. A dissimilarity matrix may be generated to represent differences between an initial image and a GAN-reconstructed image, with matrix values mapped into low-density parity check (LDPC) codewords to facilitate LDPC decoding of data. In still other examples, confidence information obtained from a GAN is incorporated into image pixels. In some examples, GAN reconstruction of data is limited to modifying valley bits. Multiple GANs may be used in parallel with their outcome aggregated.

24 Claims, 23 Drawing Sheets

(58) Field of Classification Search
CPC ......... G06F 2212/1032; G06F 12/0207; G06F 2212/7204; G06F 2212/7206; G06F 2212/7207; G06F 2212/7208; G06N 3/0455; G06N 3/045; G06N 3/047; G06N 3/08; G06N 3/088; G11C 29/021; G11C 29/028; G11C 2029/0411; G06T 1/60

See application file for complete search history.

(56) References Cited

U.S. PATENT DOCUMENTS

| | | | |
|---|---|---|---|
| 11,010,233 | B1 | 5/2021 | Golden et al. |
| 2009/0177943 | A1 | 7/2009 | Silvus et al. |
| 2017/0123898 | A1 | 5/2017 | Ryabinin et al. |
| 2019/0050987 | A1 | 2/2019 | Hsieh et al. |
| 2019/0155684 | A1 | 5/2019 | Akutsu et al. |
| 2020/0265318 | A1 | 8/2020 | Malkiel et al. |
| 2020/0341840 | A1 | 10/2020 | Chang et al. |
| 2021/0149763 | A1 | 5/2021 | Ranganathan et al. |
| 2021/0150321 | A1 | 5/2021 | Jang et al. |
| 2021/0150354 | A1 | 5/2021 | Karras et al. |
| 2021/0249085 | A1 | 8/2021 | Hong et al. |
| 2021/0303156 | A1 | 9/2021 | Kachare et al. |
| 2021/0312634 | A1 | 10/2021 | Plawinski et al. |
| 2022/0011973 | A1* | 1/2022 | Kim .................. G11C 11/5671 |
| 2022/0013189 | A1 | 1/2022 | Berman et al. |
| 2022/0058140 | A1 | 2/2022 | Zimmerman et al. |
| 2022/0101119 | A1 | 3/2022 | Tiku et al. |
| 2023/0058813 | A1 | 2/2023 | Hartz et al. |
| 2023/0099478 | A1* | 3/2023 | Hinkle .............. G11C 11/40622 365/222 |
| 2023/0114005 | A1 | 4/2023 | Navon et al. |
| 2023/0116755 | A1 | 4/2023 | Linnen et al. |
| 2023/0410266 | A1 | 12/2023 | Isikdogan et al. |
| 2024/0127563 | A1* | 4/2024 | Koujan .................. G06T 11/00 |
| 2024/0303778 | A1* | 9/2024 | Smirnov .................. G06T 5/20 |

OTHER PUBLICATIONS

Chen, Fan et al., "Efficient Process-in-Memory Architecture Design for Unsupervised GAN-based Deep Learning using ReRAM", Special Session 3: Recent Advances in Near and In-Memory Computing Circuit and Architecture for Artificial Intelligence and Machine Learning; May 9-11, 2019; https://par.nsf.gov/servlets/purl/10112454; 6 pages.

Ali, Ameer Haj et al., "IMAGING: In-Memory AlGorithms for Image processiNG", Circuits and Systems I: Regular Papers; IEEE Transactions; Jun. 2018; https://www.researchgate.net/publication/326027425_IMAGING_In-Memory_AlGorithms_for_Image_processiNG; 15 pages.

Zhong, Guoqiang et al., "Generative Adversarial Networks with Decoder-Encoder Output Noise", Computer Science: Computer Vision and Pattern Recognition; Cornell University; Jul. 11, 2018; https://arxiv.org/pdf/1807.03923.pdf; 12 pages.

Ciou, Weilun et al., "SRAF Placement with Generative Adversarial Network", Proceedings vol. 11613; Optical Microlithography XXXIV (1161305); SPIE Advanced Lithography; Feb. 22, 2021; https://doi.org/10.1117/12.2581334; 2 pages.

Wang, Yufei et al., "A Novel SSD Fault Detection Method using GRU-based Sparse Auto-Encoder for Dimensionality Reduction", Journal of Intelligent & Fuzzy Systems; vol. 43, No., 4; Aug. 10, 2022; https://content.ospress.com/articles/journal-of-intelligent-and-fuzzy-systems/ifs220590; 2 pages.

Huang, Wei et al., "Deep Natural Image Reconstruction from Human Brain Activity Based on Conditional Progressively Growing Generative Adversarial Networks", Neuroscience Bulletin 37; Nov. 22, 2020; https://link.springer.com/article/10.1007/s12264-020-00613-4; 21 pages.

Ledig, Christian et al., "Photo-Realistic Single Image Super-Resolution Using a Generative Adversarial Network", Computer Science: Computer Vision and Pattern Recognition; Cornell University; Sep. 15, 2016; https://arxiv.org/abs/1609.04802; 19 pages.

International Search Report and Written Opinion for International Application No. PCT/US2024/012754, dated May 27, 2024, 11 pages.

Dunphy, Kyle et al., "Data Augmentation for Deep-Learning-Based Multiclass Structural Damage Detection Using Limited Information", MDPI; Aug. 18, 2022; https://doi.org/10.3390/s22166193; 30 pages.

Hwang, Minyoung et al., "Dynamic Error Recovery Flow Prediction Based on Reusable Machine Learning for Low Latency NAND Flash Memory Under Process Variation", IEEE Access; vol. 10; Nov. 7, 2022; https://ieeexplore.ieee.org/document/9940942; 17 pages.

International Search Report and Written Opinion for International Application No. PCT/US2024/013535, dated Jun. 3, 2024, 8 pages.

Liu, Weihua et al., "Error Generation for 3D NAND Flash Memory", 2022 Design, Automation & Test in Europe Conference & Exhibition; Mar. 14-23, 2022; https://ieeexplore.ieee.org/document/9774514; 5 pages.

Zhang, Meng et al., "BeLDPC: Bit Errors Aware Adaptive Rate LDPC Codes for 3D TLC NAND Flash Memory", 2020 Design, Automation & Test in Europe Conference & Exhibition; Mar. 9-13, 2020; https://ieeexplore.IEEE.org/document/9116324; 5 pages.

Goodfellow, Ian J. et al., "Generative Adversarial Nets", Cornell University; Statistics: Machine Learning; Jun. 10, 2014; https://doi.org/10.48550/arXiv.1406.2661; 9 pages.

Spyridon, Plakias et al., "Generative Adversarial Networks for Unsupervised Fault Detection", 2018 European Control Conference (ECC); Limassol, Cyprus; Jun. 12-15, 2018, https://ieeexplore.IEEE.org/document/8550560; 6 Pages.

* cited by examiner

DATA STORAGE DEVICE CONFIGURED FOR USE WITH A GENERATIVE-ADVERSARIAL-NETWORK (GAN)

CROSS REFERENCE TO RELATED APPLICATIONS

This application claims priority to and the benefit of U.S. Provisional Application No. 63/457,951, entitled "DATA STORAGE DEVICE CONFIGURED FOR USE WITH A GENERATIVE-ADVERSARIAL-NETWORK (GAN)," filed Apr. 7, 2023, the entire content of which is incorporated herein by reference as if fully set forth below in its entirety and for all applicable purposes.

FIELD

The disclosure relates, in some aspects, to data storage devices having non-volatile memory (NVM). More specifically, but not exclusively, aspects relate to data storage devices configured to use generative-adversarial-networks (GANs).

INTRODUCTION

Examples of data storage devices (DSDs) incorporating non-volatile memories (NVMs) include solid state drives (SSDs), sometimes referred to as NAND flash drives, and more traditional hard disk drives with rotating disks. Generative adversarial networks (GANs) represent a type of deep-learning model within the family of generative models. Among other features, GANs are capable of producing artificial data, such as artificial images, which appear realistic. GANs may use two neural networks that compete against one another (and are thus "adversarial") to generate new and synthetic versions of datasets that can mimic real datasets, such as by creating realistic looking images. One type of GAN is a super-resolution GAN (SRGAN) that can be exploited to reconstruct a low quality image as a much sharper image.

Herein, data storage devices are disclosed that implement and exploit GANs.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a data storage device that includes: a non-volatile memory (NVM); and a data storage controller coupled to the NVM. The data storage controller includes a processor configured to: read data from the NVM; generate confidence information representative of a confidence in the reliability of the reading of the data from the NVM; and process the data using a generative-adversarial-network (GAN) procedure that is configured to use the confidence information to reconstruct the data.

Another embodiment of the disclosure provides a method for use by a data storage device that includes: reading data from an NVM of the data storage device; generating confidence information representative of a confidence in the reliability of the reading of the data from the NVM; and processing the data using a GAN procedure that is configured to use the confidence information to reconstruct the data.

Yet another embodiment of the disclosure provides an apparatus for use in a data storage device. The apparatus includes: means for reading data from an NVM of the data storage device; means for generating confidence information representative of a confidence in the reliability of the reading of the data from the NVM; and means for processing the data using a GAN procedure that is configured to use the confidence information to reconstruct the data.

DETAILED DESCRIPTION

Figure 1:
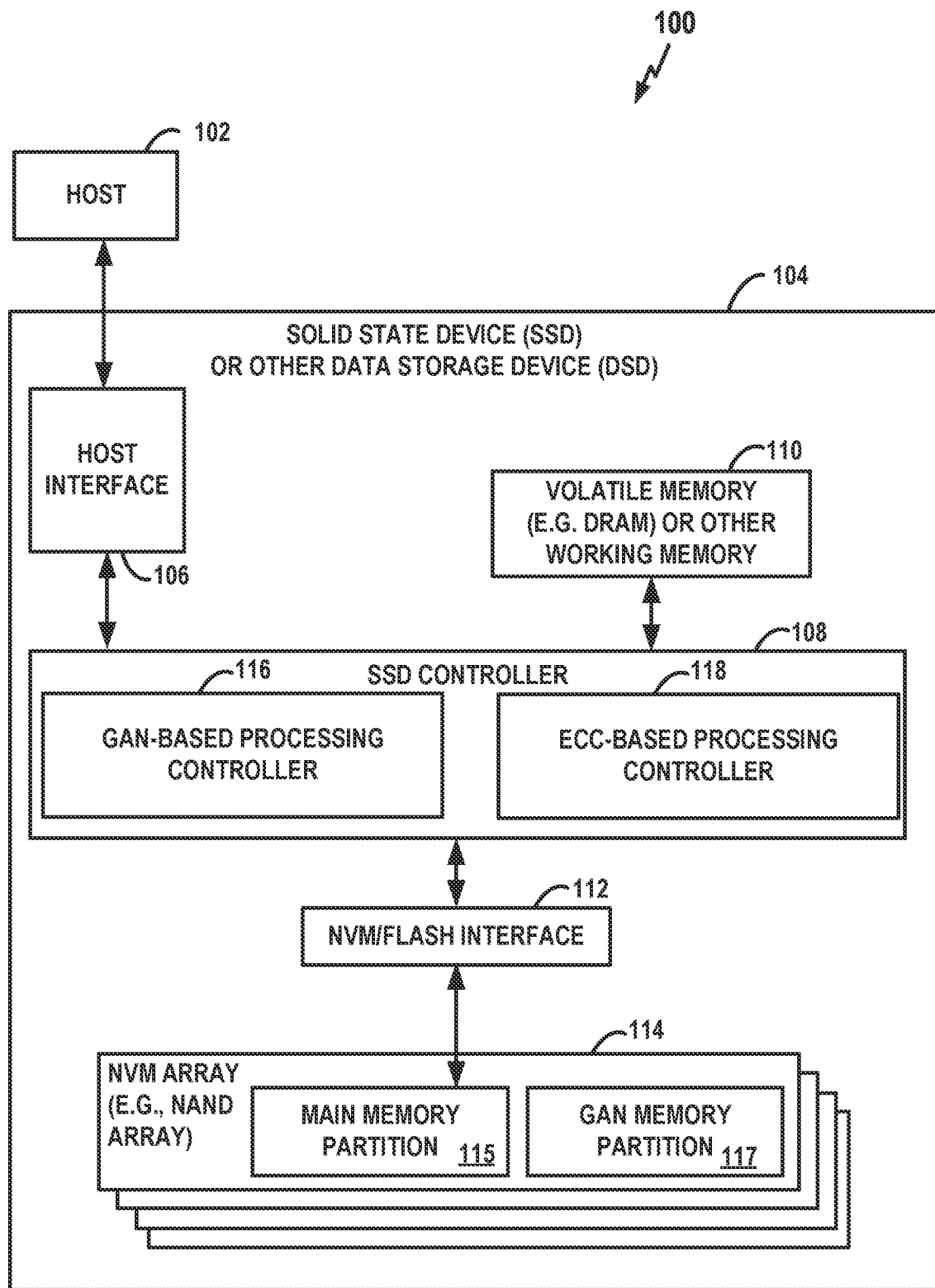
FIG. 1 is a schematic block diagram of a data storage device in the form of an exemplary solid state device (SSD), or other data storage device (DSD), having a non-volatile memory (NVM) array, where the NVM array is configured for generative adversarial network (GAN)-based processing, in accordance with aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM), and to data storage devices or apparatus for controlling the NVM, such as a controller of a data storage device (DSD), such as a solid state device (SSD), and in some examples to solid-state memory storage devices having NVM arrays such as those that use NAND flash memory (herein "NANDs"). (A NAND is a type of non-volatile storage technology that does not require power to retain data. It exploits negative-AND, i.e. NAND, logic.) For the sake of brevity, an SSD having one or more NAND dies will be used as a non-limiting example of a DSD below in the description of various embodiments. It is understood that at least some aspects described herein may be applicable to other forms of data storage devices as well. For example, at least some aspects described herein may be applicable to a data storage or memory device including phase-change memory (PCM) arrays, magneto-resistive random access memory (MRAM) arrays, storage class memory, and resistive random access memory (ReRAM) arrays. In addition, the various embodiments may be used in various machine learning devices which may include some combination of processing elements and memory/data storage elements, including the NVM arrays constructed/configured in accordance with the described embodiments. Although the primary examples described herein pertain to SSDs having NVM arrays, such as NAND die arrays, many of the features described herein may also be applied to other types of NVM, such a hard-disk drives (HDDs), tape drives, hybrid drives, or the like, etc. Some features may be applicable to volatile memories as well.

Overview

As noted above, generative adversarial networks (GANs) are capable of producing artificial data, such as artificial images, that appear realistic. GANs use two neural networks that compete against one another (and are thus "adversarial") in order to generate new and synthetic versions of datasets that can mimic real datasets, such as by creating realistic looking images. One of the neural networks is referred to a generative network, which operates generate candidates. The other neural network is referred to as the discriminative network, which evaluates the candidates. Generally speaking, the generative network generates candidate data sets, such as candidate images. The discriminative network attempts to distinguish the candidates from true data sets such as true images. The training objective of the generative network is to increase an error rate of the discriminative network (i.e., to trick the discriminative network by generating candidates that the discriminative network fails to identify as synthesized data).

One type of GAN is a super-resolution GAN (SRGAN) that can be exploited to convert low quality images into much sharper images. For example, an SRGAN may be used to process a compressed image or a corrupted image to reconstruct, reproduce, or recreate the image as a sharp high quality image. Note that the reconstructed image is not guaranteed to match the original low quality image (i.e., the corrupted or compressed image). Rather, the SRGAN intelligently estimates a probable reconstruction of the original image, if properly trained using a training procedure performed over a large dataset of similar images.

Herein, aspects of the present disclosure relate to data storage devices configured to exploit GANs (or GAN-based inference procedures) to improve data storage with data storage devices to, e.g., improve overall performance and/or provide cost reductions. Other aspects relate more specifically to exploiting SRGANS (or SRGAN-based inference procedures) to improve the storage of images with data storage devices to, again, improve overall performance and/or provide cost reductions.

In one aspect, a GAN-based decoding (reconstruction) procedure is implemented within a data storage controller to replace an error correction coding (ECC) decoding procedure to permit a reduction in the number of parity bits used while storing the data. In some GAN-based examples, no parity bits are used at all. By employing a GAN-based decoding procedure, errors within stored data—such as blurriness within highly compressed images read from an NVM or noise within uncompressed images read from a badly worn NVM—can be "corrected" to produce, e.g., sharper versions of the images. For images, the GAN-based procedure may be performed using an SRGAN. In this example, since an SRGAN is used to reconstruct the image during decoding, the reconstructed image might not exactly match the original image. but for many image processing applications (e.g., video games) an exact match is not needed. Rather, it is sufficient that the reconstructed image is a realistic-looking version of the original image. By reducing or eliminating parity bits, more data can be stored in the memory array.

Note that herein the term "GAN-based decoding" or similar terms are used to refer to a GAN-based process that "decodes" data read from a memory by reconstructing some or all of the data using GAN-based techniques, such as by reconstructing corrupted or blurry images. It should be understood that GAN-based decoding therefore differs from conventional decoding (e.g., ECC-based decoding), which instead seeks to decode data while eliminating errors in the data that may arise due to noise or other factors. Herein, the terms "GAN-based decoding" and "GAN-based reconstruction" are used interchangeably.

In some aspects, a separate GAN partition is provided in the NVM array for storing data (e.g., images) without parity bits for subsequent decoding using a GAN processing pathway. Other data (e.g., non-image data) may be stored in a separate ECC partition with parity bits for subsequent decoding using an ECC processing pathway (e.g., a decode pathway that exploits a low-density parity check (LDPC) or the like). Accordingly, before data is written to the NVM array, the data storage controller determines which partition the data is to be stored in (e.g., GAN partition for image data and ECC partition for non-image data). The determination can be made based, for example. on metadata in data received from a host, such as a namespace identifier (IDs), Host IDs, and queue IDs or based on a logical block address (LBA) range. Different trim voltages may be employed when storing data in the GAN partition versus the ECC partition, e.g., a first trim voltage vs. a second trim voltage. In other aspects, data to be stored in the GAN partition may be stored directly in a multi-level-cell (MLC) array, whereas data to be stored in the ECC partition may be stored in a single-level-cell (SLC) array.

In another aspect, data is stored with minimal parity bits and an ECC decoding procedure is initially applied in an attempt to decode the data. If the data is successfully decoded using ECC, the data is then sent to a host. However, if the ECC decoder is unable to successfully decode the data. the data is provided to the GAN for GAN-based decoding. In this manner, images without much noise are decoded using ECC. Images with significant noise (e.g., arising due to read errors from a worn NVM) can be reconstructed using the GAN. Again, this permits a reduction in the number of parity bits used while storing data.

In another aspect, data is stored with minimal parity bits and a cyclic redundancy check (CRC) is used only to detect any errors (with no attempt to correct the errors). If no errors are detected, the data is sent to a host. However, if errors are detected, the data is then provided to the GAN for GAN-based decoding. In this manner, images without errors are promptly sent to the host. Images with errors are reconstructed using the GAN. This permits a reduction in the number of parity bits used while storing data and faster overall processing.

In some aspects, soft bit information is exploited using a GAN. For example, data is read from an NVM array, e.g., by sensing using a hard bit sensing threshold, and then a GAN is used to generate GAN-based soft bit information from the data. A low-density parity check (LDPC) procedure is used to decode the data with the help of the GAN-based soft bit information. In an image-based example, pixels may be expanded to include the GAN-based soft bit information in addition to the usual pixel color information. The pixels with the soft bit information are decoded using an LDPC procedure configured to exploit the GAN-based soft bit information. In some aspects, a bit error rate (BER) is estimated and the GAN-based soft bit information is only generated if the BER exceeds the threshold. Otherwise, the LDPC decodes the data without GAN-based soft bit information. In other aspects, additional soft bit information may be generated by performing additional senses on opposing sides of the hard bit sensing threshold. The LDPC procedure may be configured to exploit both the GAN-based soft bit information and the additional soft bit information.

In an image-based example, the GAN-based soft bit information is generated using a dissimilarity matrix. For example, the GAN procedure is applied to an initial image read from the NVM array to obtain a GAN-modified image. A dissimilarity matrix is generated from differences between the initial image and the GAN-modified image, wherein the matrix includes dissimilarity score values representative of an amount by which each pixel within the GAN-modified image differs from the initial image. The dissimilarity matrix is mapped to a codeword representative of the image to be decoded by the LDPC procedure. The values in the matrix are allocated to bits within the codewords so the LDPC procedure will place relatively less emphasis on bits that have relatively high dissimilarity scores and will place relatively more emphasis on bits that have relatively low dissimilarity scores. The LDPC then uses the modified codewords during the decoding process.

In these GAN-based soft bit examples, the GAN may be initially trained off-line (e.g., using a host processor) to generate the soft bit information. GAN procedures may be trained differently based on the particular type of image data to be processed, e.g., videogame images as opposed to other types of images. In some examples, the GAN procedure is trained using a cost function comprising a penalty term representative of a number of bit flips between initial images and GAN-reconstructed images to thereby train the GAN procedure to preserve much of the initial images within the GAN-reconstructed images. That is, it is advantageous that reconstructed images are not significantly different from the original images (e.g., the total number of bit flips may be restricted or limited to some maximum number). This is done so the GAN only flips bits when it has high confidence the bit needs to be flipped. The GAN thus also has high confidence that bits that are not flipped are correct.

In other aspects, various types of confidence information can be exploited. For example, pixel data is read from an NVM array and confidence information is generated that is representative of a confidence in the reliability of the reading of the pixel data from the NVM array. The pixel data is then decoded (reconstructed) using a GAN procedure that is configured to use the confidence information in the decoding of the pixel. In some examples, the confidence information is generated as soft bits based, for example, on Log Likelihood Ratios (LLRs). In some examples, pixel data is initial decoded in a preliminary processing stage using two or more different GAN procedures in parallel (without using confidence information). The results are compared and, if the different GAN procedures yielded the same preliminarily decoded pixel data, the confidence is assessed to be high. On the other hand, if there are numerous bit flips between the resulting decoded pixels, then confidence is assessed to be low. That is. confidence can be quantified based on the number of bit flips. Hence, the confidence level can be quantified using both LLR and a GAN-based procedure. Once quantified, the confidence level can be represented as soft bits for use in further decoding. In other examples, confidence values may be obtained from inference-based or rules-based procedures, such as spell checkers, auto-correct, predictive text models, and artificial intelligence (AI) procedures.

In other aspects, confidence information is obtained by obtaining and exploiting valley bits (i.e., bits that flip states when read voltages are adjusted slightly). In one example, first and second senses of bits of the pixel may be performed using first and second different read voltages to obtain first and second reads of the pixel data. A first set of valley bits are identified within the first and second reads of the pixel data. The first and second reads of the pixel data are applied to first and second GAN procedures to obtain first and second GAN output data. A second set of valley bits are then obtained from the first and second GAN output data and the bits of the second set of valley bits are counted and compared to an error threshold. If the count of the second set of valley bits exceeds the error threshold, a first (low) confidence value is assigned to the pixel data; otherwise a second (high) confidence value is assigned. If the confidence is low, the pixel data is reapplied to one or both of the GAN procedures to obtain additional GAN output data and thereby obtain additional sets of valley bits. The valley bit count is updated and the compared again to the error threshold. In this manner, the procedure can be iteratively repeated until the confidence level is satisfactory. As will be explained below. the valley bit-based procedures may be performed using high speed AND and XOR operations to expedite processing.

In other aspects, most or all of the foregoing GAN-based procedures can exploit multiple GANs with results aggregated or otherwise combined. In one example, different weights are applied to the output of multiple GAN processors to compensate for known noise sources, such as known noise sources within the NVM array due, for example, to worn blocks. In another example, the multiple GAN processors are trained differently to accommodate different types of noise. In yet another example, several copies of stored data are read from the NVM array using different read voltages and the separate copies are applied to the separate GAN processors with the results aggregated. In other examples, the results of separate GAN procedures are combined by determining a median for use as the combined result or by determining the average while excluding maximum and minimum values.

Note that herein the term GAN encompasses GAN-like procedures and variants. that is, procedures or variants that exploit a generative adversarial machine learning procedure or algorithms. One example is the original GAN algorithm designed by Goodfellow et al. and described in *Generative Adversarial Nets*. Proceedings of the International Conference on Neural Information Processing Systems (NIPS 2014). pp. 2672-2680. Other, GAN-like procedures or variants include but are not limited to: conditional GANs; GANs with alternative architectures such as deep convolutional GAN (DCGAN), self-attention GAN (SAGAN). variational autoencoder GAN (VAEGAN), transformer GAN (TransGAN), and flow-GAN; GANs with alternative objectives such as non-saturating loss GANs, maximum likelihood GANs, least squares GANs, etc., and many other variants.

Some GANs are configured for use with particular types of data, such as image data or audio data. Hence, if the DSD is a dedicated device intended to process a particular type of data, e.g., still images, video, text, or audio, a GAN may be chosen during the design phase of the DSD that is suited for use with that particular type of data. As noted, SRGAN is especially useful for image data or frames of video. If the DSD is intended to process different types of data, such as both audio and video, the DSD can be equipped with different types of GANs so that the device can route the data to the appropriate GAN. Note that some types of data are not appropriate for GANs, such as scrambled or encrypted data. However, in some DSDs, data can be stored in a scrambled or encrypted form in the NVM, so long as it is unscrambled or decrypted before applying it to the GAN.

These and other features will be described below.

Exemplary Data Storage Device With GAN-Based Processing

FIG. 1 is a block diagram of a system 100 including an exemplary SSD (or DSD) having components configured for use with GAN. The system 100 includes a host 102 and an SSD 104 or other DSD coupled to the host 102. The host 102 provides commands to the SSD 104 for transferring data between the host 102 and the SSD 104. For example, the host 102 may provide a write command to the SSD 104 for writing data to the SSD 104 or a read command to the SSD 104 for reading data from the SSD 104. The host 102 may also provide GAN-based parameters for use in controlling GAN processing, such as the parameters of a GAN that has been trained by the host 102. The host 102 may be any system or device with a need for data storage or retrieval and a compatible interface for communicating with the SSD 104. For example, the host 102 may be a computing device, a personal computer, a portable computer, a workstation, a server, a personal digital assistant, a digital camera, or a digital phone as merely a few examples. Additionally or alternatively, the host 102 may be a system or device having a need for neural network processing, such as image or speech processing. For example, the host 102 may be a component of a video game system.

The SSD 104 includes a host interface 106, an SSD controller 108, a volatile memory 110 (such as DRAM) or other working memory, an NVM interface 112 (which may be referred to as a flash interface), and an NVM array 114. The NVM array 114 includes one or more NAND dies, one or more of which is configured with (a) a main memory partition 115 (e.g., regular flash memory for storing data with ECC parity bits) and (b) a GAN memory partition 117 (e.g., alternative memory for use with a GAN that stores data with fewer parity bits or no parity bits). In some examples, data to be processed using a GAN is stored in the GAN memory partition 117 with reduced parity (or no parity). However, in other examples, data to be processed using a GAN is stored in the main memory partition 115 with standard parity. In still other examples, there is no separate GAN memory partition.

The SSD controller 108 includes a GAN-based processing controller 116 for controlling the GAN-based functions (such as GAN-based decoding/reconstruction of data sensed from the GAN memory partition 117) and an ECC-based processing controller 118 for controlling various ECC-based functions (such as LDPC-based decoding of data sensed from the main memory partition 115). Note that, although described primarily with reference to examples where the GAN-based processing controller 116 is a component of the SSD controller 108, the GAN-based processing controller 116 instead may be separate from the SSD controller 108. Some functions of the GAN-based processing controller 116 may be implemented within the host 102 or other device separate from the SSD 104. Note also that SSD and SSD controller throughout the figures are used for illustrative examples only, and the various embodiments can include using the disclosed GAN-based data processing methods in the controller for other types of storage devices such as HDD and tape drives.

The host interface 106 is coupled to the SSD controller 108 and facilitates communication between the host 102 and the SSD controller 108. The SSD controller 108 is coupled to the volatile memory 110 as well as NVM array 114 via the NVM interface 112. The host interface 106 may be any suitable communication interface, such as a Non-Volatile Memory express (NVMe) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example. the host 102 may communicate with the SSD 104 through a wireless communication link.

Although, in the example illustrated in FIG. 1, SSD 104 includes a single channel between SSD controller 108 and NVM die(s) 114 via interface 112, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The SSD controller 108 may be implemented in a single integrated circuit chip and may communicate with different layers of memory in the NVM die(s) 114 over one or more command channels.

The SSD controller 108 controls operation of the SSD 104. In various aspects, the SSD controller 108 receives commands from the host 102 through the host interface 106 and performs the commands to transfer data between the host 102 and the NVM array 114. The SSD controller 108 and/or the NVM interface 112 may include flash management components. e.g., a flash translation layer (FTL).

The SSD controller 108 may include any type of processing device, such as a microprocessor, a microcontroller, an embedded controller, a logic circuit, software (SW), firmware (FW), hardware (HW) or the like. In some aspects, some or all of the functions described herein as being performed by the SSD controller 108 may instead be performed by another element of the SSD 104. For example, the SSD 104 may include a microprocessor, a microcontroller, an embedded controller, a logic circuit, software, FW, or any kind of processing device, for performing one or more of the functions described herein as being performed by the SSD controller 108. According to other aspects, one or more of the functions described herein as being performed by the SSD controller 108 are instead performed by the host 102. In still further aspects, some or all of the functions described herein as being performed by the SSD controller 108 may instead be performed by another element such as a controller in a hybrid drive including both non-volatile memory elements and magnetic storage elements.

The volatile memory 110 may be any suitable memory, computing device, or system capable of storing data. For example, the volatile memory 110 may be ordinary RAM, DRAM, double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or other fast non-volatile memory such as storage class memory (e.g., MRAM, ReRAM, PCM) or the like. In various embodiments. the SSD controller 108 use the volatile memory 110, or a portion thereof, to store data during the transfer of data between the host 102 and the NVM array 114. For example, the volatile memory 110 or a portion of the volatile memory 110 may be a cache memory. The NVM array 114 receives data from the SSD controller 108 via the NVM interface 112 and stores the data in the NVM array 114. The NVM array 114 may be any suitable type of non-volatile memory, such as a NAND-type flash memory or the like. In some embodiments, volatile memory 110 may be replaced by a non-volatile memory such as MRAM, PCM, ReRAM, etc. to serve as a working memory for the overall device.

Although FIG. 1 shows an exemplary SSD and an SSD is generally used as an illustrative example in the description throughout, the various disclosed embodiments are not necessarily limited to an SSD application/implementation. As an example, the disclosed NVM die and associated processing components can be implemented as part of a package that includes other processing circuitry and/or components. For example, a processor may include, or otherwise be coupled with, embedded NVM and associated circuitry and/or components for GAN processing that are described herein. The processor could, as one example, off-load certain GAN processing tasks from the controller 108 to the other circuitry and/or components.

Figure 2:
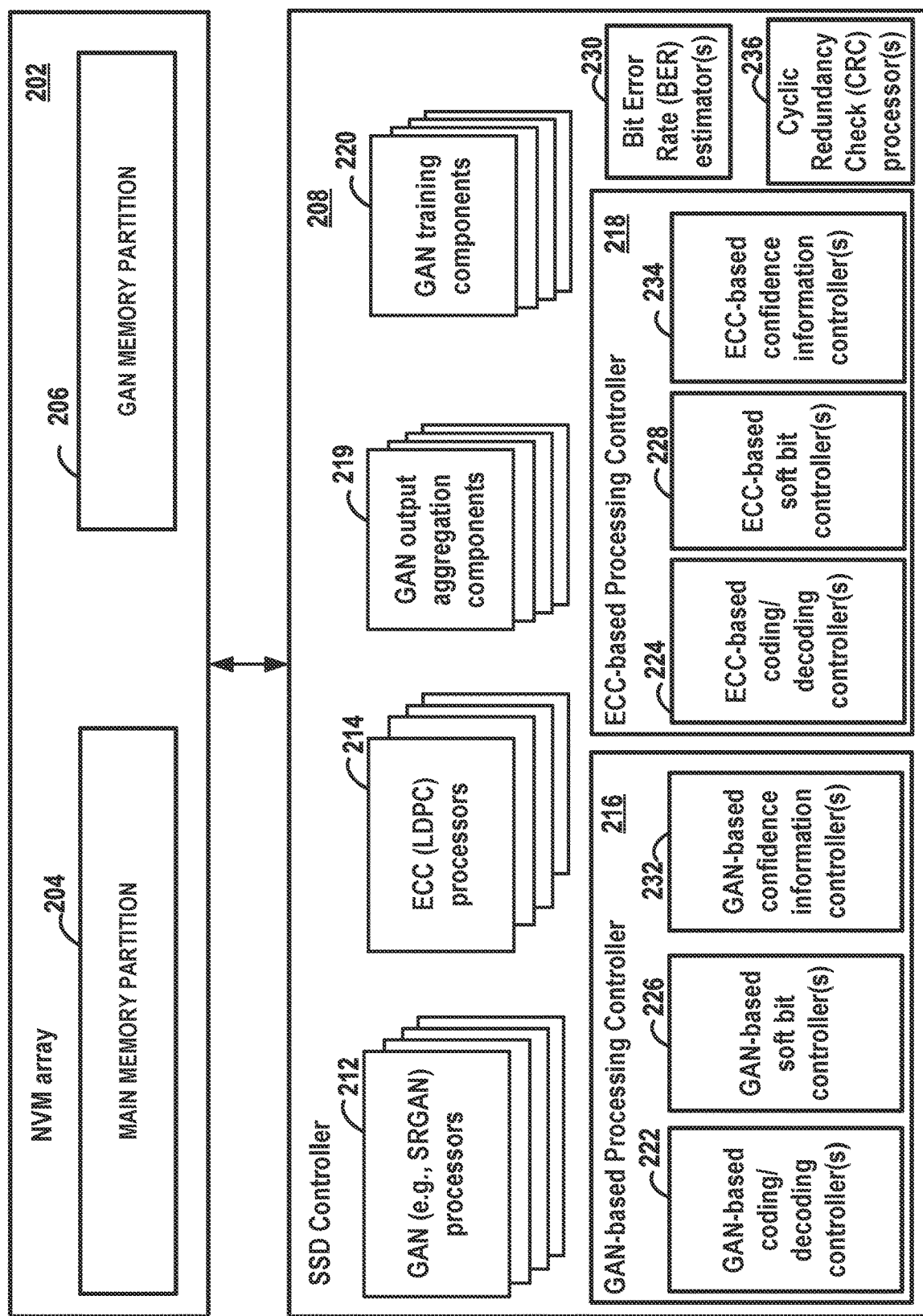
FIG. 2 illustrates exemplary components of a DSD that has a main memory partition and a GAN memory partition and various components for GAN-based processing and ECC-based processing, in accordance with aspects of the disclosure.

FIG. 2 illustrates a block diagram of an exemplary NVM array 202 (consisting of one of more NVM dies) configured to store some data in a main memory partition 204 (with a standard number of parity bits) and to store other data (e.g., images) in a GAN memory partition 206 (with fewer parity bits or no parity bits). Not all circuit or memory components that might be used in a practical NVM array are illustrated in the figure, such as input/output components. voltage regulation components, clocks and timing components, etc. Rather only some components and circuits are shown, summarized as block or schematic diagrams.

The SSD controller 208 of FIG. 2 includes components configured to perform or control GAN-based operations and other non-GAN operations, such as otherwise standard ECC processing. In the example of FIG. 2, the exemplary SSD controller components include: one or more GAN (or GAN-like) processors 212 configured to perform at least some GAN processing operations (e.g., SRGAN inference operations) on data obtained from GAN memory partition 206; one or more ECC processors 214 configured to perform at least some ECC operations on data obtained from the main memory partition 204 (which may include LDPC-based processing); one or more GAN output aggregation components 219 configured to combine or otherwise aggregate the outputs of the GAN processors 212, as will be described below; and one or more GAN training components 220 configured to train or re-train the GAN processors 212. It is noted that GAN training can be computationally very time consuming and hence training of the GANs may instead be performed using host processors (with the trained GAN networks loaded into the SSD controller 208). However, in some examples, GAN training may be performed in the SSD controller and so GAN training components 220 are shown. Multiple instances of each of these components (e.g., 212, 214, 219, and 220) are shown since, in some examples. a plurality of such devices may operate in parallel. Furthermore, at least some of these components (such as 212, 214, 219, and 220) may be configured on-chip, i.e., on an NVM die of NVM array 202 that stores the data using, for example, under-the-array or next-to-the-array circuitry.

In the example of FIG. 2, the SSD controller 208 of FIG. 2 also includes a GAN-based processing controller 216 and an ECC-based processing controller 218. The GAN-based processing controller 216 includes one or more GAN-based coding/decoding controller(s) 222 configured to control storage of data into the GAN memory partition (e.g., as part of a write operation) and to control decoding (reconstructing) data sensed from the GAN memory partition 206 (e.g., as part of a read operation) by using a GAN procedure (or GAN-based inference procedure) performed by one or more of the GAN processors 212. As noted above, data may be stored in the GAN memory partition 206 with few (if any) parity bits, and yet by employing a GAN-based decoding procedure, errors within stored data—such as blurriness within highly compressed images or noise within uncompressed images read from a badly worn NVM—can be "corrected" to produce, e.g., sharper versions of the images. For images, the GAN-based procedure may be an SRGAN procedure.

The ECC-based processing controller 218 includes one or more one or more ECC-based coding/decoding controller(s) 224 configured to control storage of data into the main memory partition (e.g., as part of a write operation) and decode data sensed from the main memory partition 204 (e.g., as part of a read operation) by using an ECC procedure (e.g., an LDPC procedure) performed by one or more of the ECC (LDPC) processors 214. In some examples, a standard (first) number of parity bits may be used for data stored in the main memory partition 204 with a smaller (second) number of parity bits used for data stored in the GAN memory partition 206. Note that the ECC-based coding/decoding controller(s) 224 may also be used to attempt to decode data read from the GAN memory partition 206. As noted above, in some examples, ECC decoding procedure is initially applied in an attempt to decode data. If the data is successfully decoded using ECC, the data is then sent to a host. However, if the ECC-based decoder 224 is unable to successfully decode the data, the data is provided to the GAN-based decoder 222. In other examples, the CRC processor(s) 236 are used to detect any errors in data read from the GAN memory partition 206 (with no attempt to correct the errors). If no errors are detected, the data is sent to a host. If errors are detected, the data is then provided to the GAN-based decoder 222 for GAN-based decoding.

The SSD controller 208 also includes one or more GAN-based soft bit controller(s) 226 configured to control the generation and processing of soft bits using GAN and one or more ECC-based soft bit controller(s) 228 configured to control the generation and processing of soft bits using ECC. For example, under the control of the GAN-based soft bit controller(s) 226, data may be read from the GAN memory partition 206 by sensing bits using a hard bit sensing threshold. The sensed data is processed using the GAN processors 212 to generate GAN-based soft bit information from the data, which is then applied to the ECC processors 214 to use a an LDPC procedure to decode the data with the help of the GAN-based soft bit information. As already noted, in an image-based example, pixels may be expanded to include the GAN-based soft bit information in addition to the usual pixel color information. The pixels with the soft bit information may be decoded using an LDPC procedure configured to exploit the GAN-based soft bit information. In some examples, the GAN-based soft bit controller(s) 226 use dissimilarity matrices, described in detail below. to modify codewords for LDPC processing. Additional soft bits may be obtained under the control of the ECC-based soft bit controller 228 by, e.g., performing additional senses on opposing sides of the hard bit sensing threshold. The LDPC procedure of ECC processor(s) 214 may be configured to use both the GAN-based soft bits and the additional soft bits.

One or more BER estimator(s) 230 estimate BER for data read from the GAN memory partition 206 (and for data read from the main memory partition 204). In some examples, GAN-based soft bit information is only generated by the GAN-based soft bit controller(s) if the BER exceeds the threshold. Otherwise, the ECC processor(s) 214 decodes the data without GAN-based soft bit information.

Note that when using GAN-based soft bits, the GAN processors 212 may be trained offline to use the soft bits in the GAN process. For example, the GAN processors 212 may be trained based on images having pixels that include the soft bits.

The SSD controller 208 also includes one or more GAN-based confidence information controller(s) 232 configured to control the generation and processing of confidence information using GAN and one or more ECC-based confidence information controller(s) 234 configured to control the generation and processing of confidence information using ECC. For example, under the control of the GAN-based confidence information controller(s) 226, pixel data is read from the GAN memory partition 206 and confidence information is generated that is representative of a confidence in the reliability of the reading of the pixel data from the GAN memory partition 206. The pixel data is then decoded (reconstructed) using a GAN processor 212 that is configured to use the confidence information in the decoding of the pixel.

In some examples, the confidence information is generated as soft bits based, for example, on LLRs. In other examples, pixel data is initially decoded in a preliminary processing stage using at least two different GAN procedures of the GAN processors 212 (without using confidence information). The results are compared by the GAN-based confidence information controller 232 and, if the different GAN procedures yielded the same preliminarily decoded (reconstructed) pixel data, the confidence is deemed to be high. On the other hand, if there are numerous bit flips between the resulting decoded pixels, confidence is deemed to be low. In this manner, confidence is quantified based on the number of bit flips. Moreover, the confidence level can be quantified using both LLR and GAN. Once quantified, the confidence level can be represented as soft bits for use in further decoding using the GAN-based soft bit controller(s) 226 and/or the ECC-based soft bit controller(s) 228. In some examples. if the GAN flips data (e.g., a pixel) that is deemed to have high confidence, that data is unflipped so that only low confidence data is changed by the GAN, while high confidence data is preserved. After unflipping data in the latest GAN output, the GAN output is compared to the previous version of the GAN output (e.g., a previous GAN output image). If differences between the new version of the GAN output and the previous version of the GAN output are acceptable (e.g., below a difference threshold), the process is complete and the data (e.g., the processed image) is output to a host. On the other hand, if the differences are not acceptable (e.g., above the difference threshold), the latest version of the GAN output may be fed back into the ECC-based soft bit controller(s) 228 for further processing to generate updated confidence information for applying to the GAN-based soft bit controller(s) 226 and the process repeats until adequate convergence is achieved. This will be described in greater detail below.

Furthermore, as will be explained in detail below, the GAN-based confidence information controller(s) 232 may exploit valley bits (i.e., bits that flip states when read voltages are adjusted slightly) to assess confidence in an iterative process using high speed AND and XOR operations to expedite processing. One or more CRC processor(s) 236 may be provided.

Note that not all of the features shown in FIG. 2 are required. For example, in some embodiments, only single instances of the various processors or components (212, 214, 219, and 22) are provided rather than multiple instances. Not all of the controller(s) 222 224, 226, 228, 230, 232, 234, and 236 are required either. Moreover, some of the controllers or processors may instead be implemented within memories dies of the NVM array 202, e.g., using under-the-array circuitry.

Exemplary GAN-Based Procedures That Replace or Supplement ECC Procedures

In this section, systems and procedures are described that provide a GAN-based storage system in which the ECC protection is either performed as backup to GAN and/or is replaced by GAN or SRGAN-like like models. The GAN/SRGAN reconstruction is executed during the read path and, in some examples, is implemented on top of (i.e., in addition to standard LDPC/ECC decoding) or replaces otherwise standard ECC protection. In the following, examples involving visual data (e.g., images/videos) are provided but it should be understood that these features are not limited to visual data.

For example, a designated DSD is provided that is (mainly) targeted for storing visual data or the DSD has a dedicated die or dedicated partition for such data. The stored data preferably belongs to specific distribution (such as specific computer game types) so that a GAN training procedure can be initially executed offline using large amounts of source data (e.g., source images) and specialized generative learning capabilities to create a GAN-like or SRGAN-like model. The model is trained to be capable of reproducing the source images out of distorted/blurred/damaged images.

In a first example, the amount of memory allocated to ECC parity is reduced, e.g. by a factor of five (or eliminated), which can yield significant cost reductions. Generally speaking, an LDPC/ECC is expected to successfully decode ~99.99% of images read from an NVM when implemented using ultra-low processing (ULP) or low processing (LP) decoding modes. Full power (FP) is even more effective. In an illustrative example, the DSD is configured to perform ULP/LP ECC but not FP ECC. Rather, the FP decoding mode is replaced with a SRGAN inference reconstruction module, which is implemented within the DSD either with a designated HW module or by using existing computation engines of the DSD. Hence, in this example, memory costs are reduced (due to the reduced parity allocated for ECC) and the LDPC HW is simplified (by omitting the FP decoding mode). In this example, when data is determined to be appropriate for storing in the GAN partition (as indicated by the host in metadata properties sent to the DSD) or inferred by the DSD (e.g., from characteristics of the data), the data is encoded with a small parity size while, in some examples, keeping metadata with some of its properties in the header. For example, the header may include information about the type of the data such as image or video frame. For video, the order of frames in a video read may be tracked and exploited by the GAN.

In a second example. data is written (programmed) into the NVM array without any encoding and is thereafter read without decoding. No parity is allocated. This example is especially useful within a dedicated visual die/device, which is intended for storing images. The read data may be processed by a fast SRGAN inference module (or might instead be reconstructed by the host). In this second example, the programming (write) path is greatly reduced (as well as the cost of the memory), although longer read durations may be required, which can be mitigated using a designated fast inference SRGAN HW module. Hence, in this example, the DSD need not have LDPC circuitry.

In the second example, an Intermediate Storage (IS) component that might otherwise be provided in the DSD may be omitted. (An Intermediate Storage component is often used as a temporary buffer in high quality SLC memory that allows for data to be written quickly without inducing errors. The usual storage goal is to then fold the data from the Intermediate Storage to regular storage in quad-level-cell (QLC) memory or other MLC memory). In this second example, the Intermediate Storage can be omitted because errors on the read path can be tolerated or corrected using the GAN.

In the second example, the program (write) path can also be configured to use a faster trim on the NVM (NAND) memory to speed up writes. The faster trim can result in more errors but since the images are subsequently reconstructed using GAN, such errors can be tolerated. Additionally, CRC can be used for each image to provide some amount of error detection. Images can therefore be read very fast with no error correction. For corrupted images, GAN is applied during read (either by the DSD or in some examples by the host). Corruption may be determined, for example, from syndrome weights.

Figure 3:
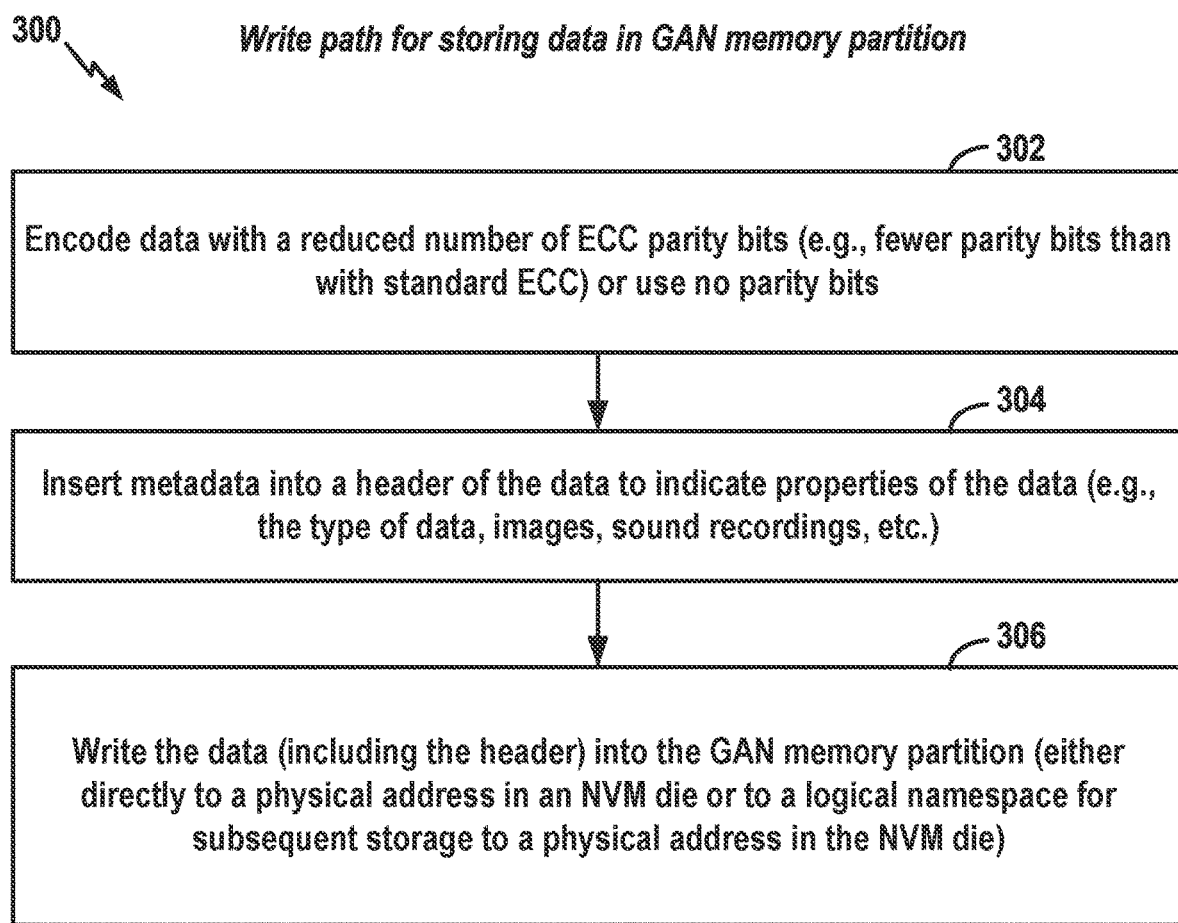
FIG. 3 illustrates an exemplary method for a write path for storing data in a GAN memory partition, in accordance with aspects of the disclosure.

FIG. 3 is a flowchart providing a broad overview of a write path method for storing data in a GAN memory partition in accordance with the forgoing examples. At block 302, a processor (such as the GAN-based coding/decoding controller 222 of FIG. 2) encodes data to be stored with a reduced number of ECC parity bits (e.g., fewer parity bits than usual with standard ECC in accordance with the first example) or no parity bits are used (e.g., no encoding in accordance with the second example). At block 304, the processor inserts metadata into a header of the data to indicate properties of the data (e.g., the type of data, images, sound recordings, etc., or, more specifically, whether images are part of a cartoon or a live action movie). At block 306, the processor writes the data (including the header) into the GAN memory partition (either directly to a physical address in an NVM die or to a logical namespace for subsequent storage to a physical address in the NVM die).

Figure 4:
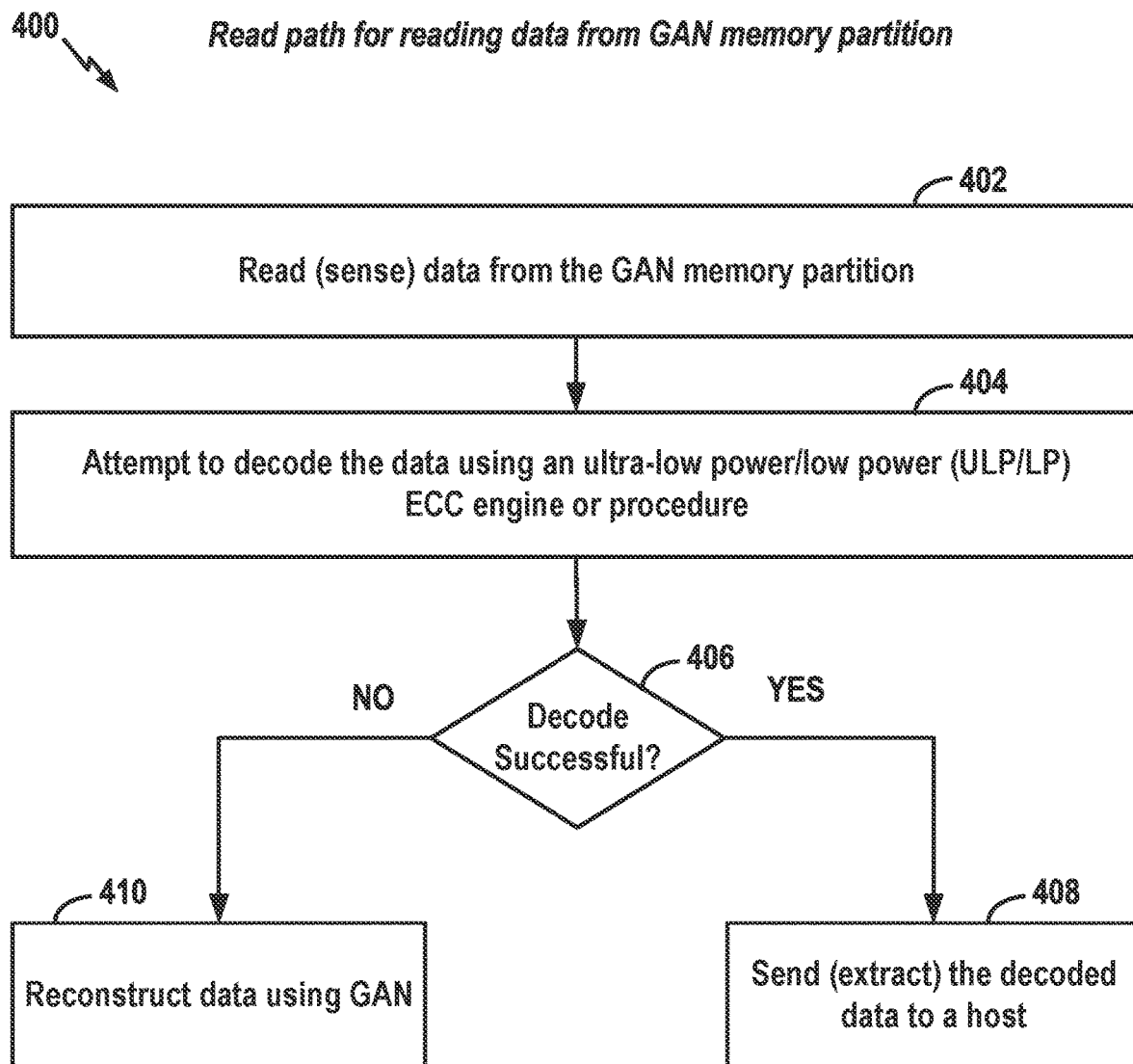
FIG. 4 illustrates an exemplary method for a read path for decoding data read from an NVM using a GAN, in accordance with aspects of the disclosure.

FIG. 4 is a flowchart providing a broad overview of a read path method for decoding data read from a GAN memory partition in accordance with the first example. At block 402, a processor (such as the ECC-based coding/decoding controller 224 of FIG. 2) reads (senses) data from the GAN memory partition (e.g., in response to host read command) and, at block 404, attempts to decode the data using a ULP/LP ECC procedure or engine (such as ECC processors 214 of FIG. 2). If the ECC-based decode is successful, as determined at block 406, then the decoded data is sent (e.g., extracted and sent) to the host that requested the data at block 408. If the decode is not successful, the data is reconstructed, at block 410, using GAN, e.g., under the control of the GAN-based coding/decoding controller 222 of FIG. 2.

Figure 5:
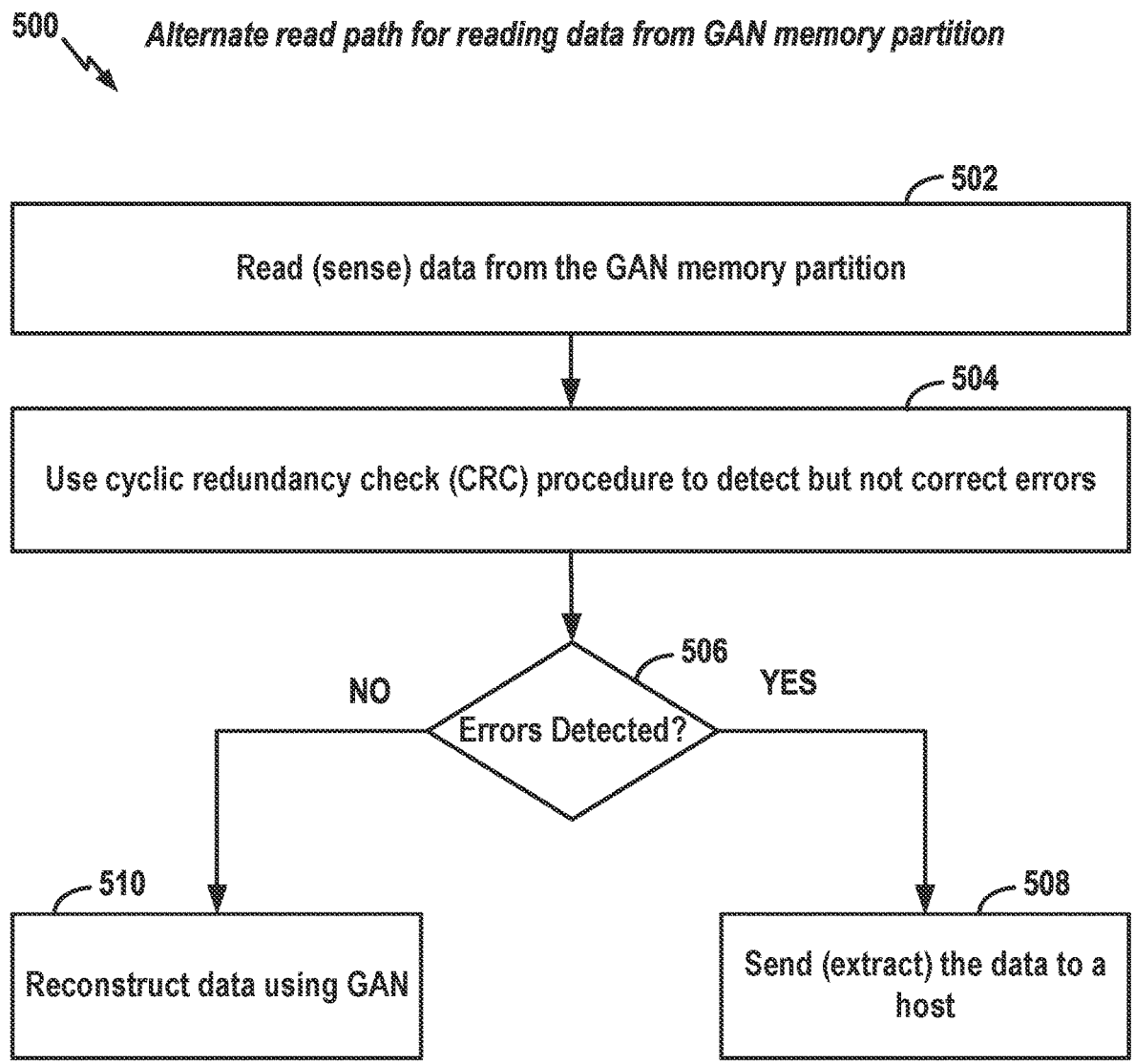
FIG. 5 illustrates an exemplary alternate method for a read path for decoding data read from an NVM using a GAN, in accordance with aspects of the disclosure.

FIG. 5 is a flowchart illustrating an alternative read path method in accordance with the second example. At block 502, the SSD controller reads (senses) data from the GAN memory partition (e.g., in response to host read command) and, at block 504, detects any errors in the data using CRC (such as by using CRC processor(s) 236 of FIG. 2). If no errors are detected, as determined at decision block 506, then the data (which needs no further decoding) is sent (e.g., extracted and sent) to the host that requested the data at block 508. If errors are detected, the data is reconstructed, at block 510, using GAN, e.g., under the control of the GAN-based coding/decoding controller 222 of FIG. 2.

Figure 6:
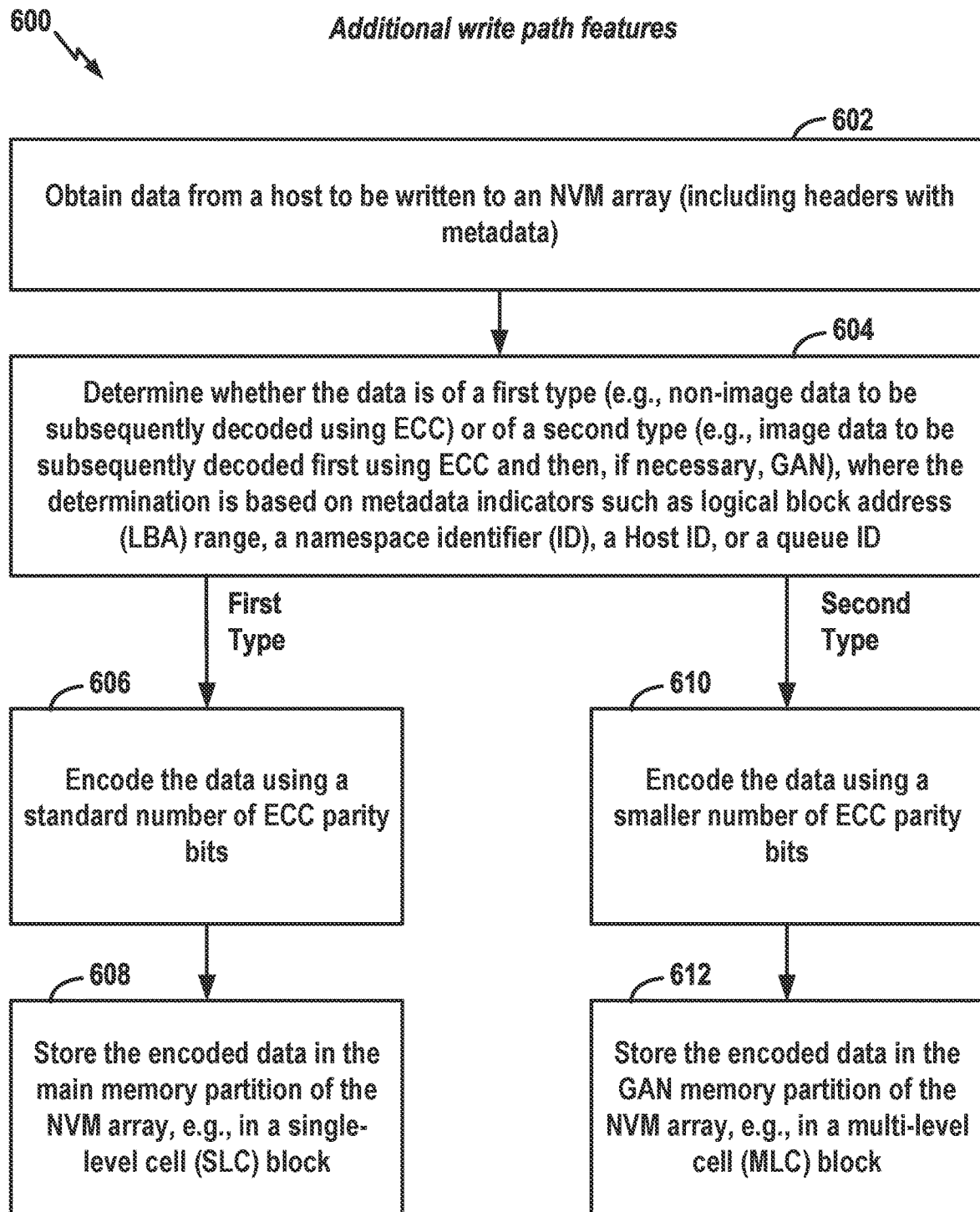
FIG. 6 illustrates additional features of an exemplary method for a write path for storing data to an NVM in which some data is stored in a main memory partition and other data is stored in a GAN partition, in accordance with aspects of the disclosure.

FIG. 6 is a flowchart illustrating additional or alternative write path method features in accordance with the first example. At block 602, the DSD obtains data from a host to be written to an NVM array (including headers with metadata). At block 604, a component of the DSD (e.g., GAN-based coding/decoding controller(s) 222 of FIG. 2) determine whether the data is of a first type (e.g., non-image data to be subsequently decoded using ECC) or of a second type (e.g., image data to be subsequently decoded first using ECC and then, if necessary, GAN), where the determination is based on metadata indicators such as logical block address (LBA) range, a namespace identifier (ID), a Host ID, or a queue ID. For example, some LBA ranges may be designated for use with image data whereas other LBA ranges are designated for use with non-image data, or some host queues may be designated for use with image data, whereas other host queues may be designated for use with non-image data. If the data is of the first type, then, at block 606, a component of the DSD (e.g., ECC-based coding/decoding controller(s) 224 of FIG. 2) encodes the data using a standard number of ECC parity bits (e.g., three bits per byte). At block 608, the encoded data is then stored in the main memory partition of the NVM array within, e.g., an SLC block (which generally exhibit fewer read/write errors than MLC blocks). On the other hand, if the data is of the second type, then, at block 610, a component of the DSD (e.g., GAN-based coding/decoding controller(s) 222 of FIG. 2) encodes the data using a smaller number of ECC parity bits (e.g., only one). At block 612, the encoded data is then stored in the GAN memory partition of the NVM array within, e.g., an MLC block. In this regard, if the data is image data that will eventually be reconstructed using GAN, then the sort of read/write errors occurring in MLC blocks can be more readily tolerated.

Note that the procedures of FIGS. 3-6 can be performed using multiple GANs in which GAN results are aggregated or otherwise combined. For example, read path operations can be performed in parallel (e.g., at block 402 of FIG. 4 and block 502 of FIG. 5) to read several copies of data from the GAN memory partition using different read voltages and the separate copies are applied to the separate GAN processors (e.g., at block 410 of FIG. 4 and block 510 of FIG. 5) with the results aggregated by, e.g., determining a median for use as the combined result or by determining the average while excluding maximum and minimum values, as discussed above.

Exemplary GAN-Based Procedures That Exploit GAN Pre-Processing Before LDPC

In this section, systems and procedures are described that provide a GAN-based storage system in which a GAN or a GAN-like system is used to generate soft bit information that may be used by an ECC/LDPC decoder to subsequently error correct data (alone or in combination with other soft bit information). That is, a GAN is used for preprocessing data to obtain soft bit information before LDPC is used to correct the data. The GAN is trained so that the metric that is optimized by the GAN is related to the ECC/LDPC metric. In this manner. soft bits generated by the GAN are used to improve the error correction capabilities of the ECC/LDPC decoder. Note that, although a standard GAN is not bit-based, soft bit information can nevertheless be generated by or exploited by GAN-based systems by, for example, converting standard bits into pixels for processing by the GAN.

Herein, ECC/LDPC decoder can also use standard soft bit information obtained by performing additional senses. In this regard, one the major advantages of LDPC codes is the capability to exploit soft reliability information, which approximately doubles the correction capabilities of the decoder. Soft information can be generated in the form of "soft-bits," which (traditionally) are additional senses (e.g., flash NAND senses) performed above and below of the hard bit voltage read threshold and indicate whether each bit is close to the hard bit threshold, making it less reliable, or far from the threshold, making it more reliable. The procedures described in this section can exploit both GAN-generated soft bits and traditional soft bits obtained by performing additional senses. An ensemble of GANs can be used.

Note that when applying these GAN-based procedures to images, a "distance" between pixels may be defined based on visual metrics rather than bit flips. Also, depending on the particular GAN model, some examples may include converting from standard bits to pixels so the GAN can process the data. Examples involving visual data (e.g., images/videos with pixels) are provided herein, but it should be understood that some features are not limited to visual data but can be applied to other types of data as well.

Figure 7:
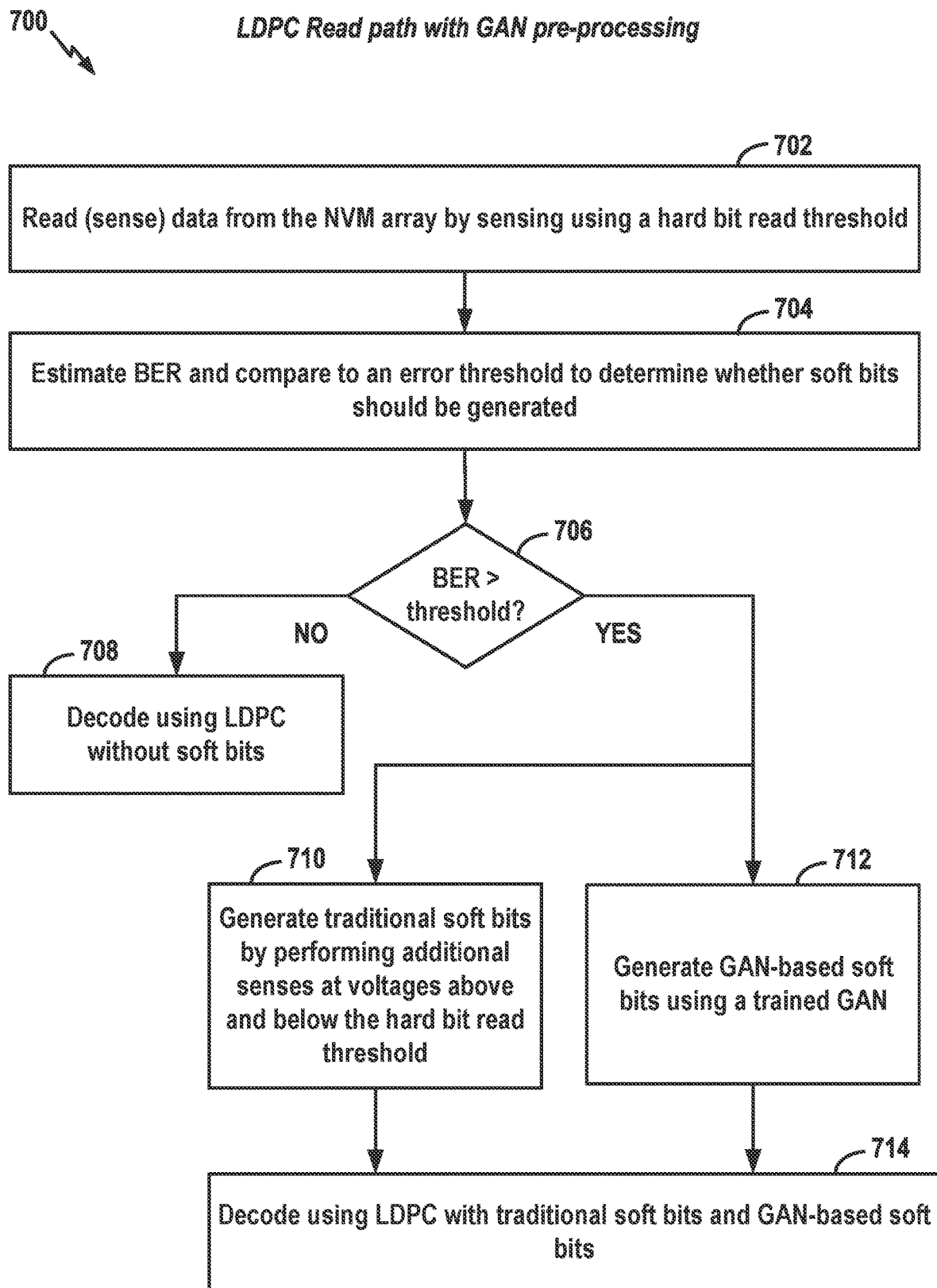
FIG. 7 illustrates features of an exemplary method for a read path for reading data from an NVM with GAN-based pre-processing to generate soft information bits, in accordance with aspects of the disclosure.

FIG. 7 is a flowchart providing a broad overview of a read path method for reading data from an NVM array while selectively exploiting GAN-based soft bits. At block 702, a processor (such as the GAN-based coding/decoding controller 222 of FIG. 2) reads (senses) data from an NVM array by sensing using a hard bit read threshold. Note here that the data does not need to be in a GAN partition that uses fewer parity bits (or no parity bits). Rather. the data can be stored in an otherwise standard NVM as codewords with parity bits for LDPC error detection and correction. At block 704, the DSD estimates BER (using, for example, BER estimator 230 of FIG. 2) and compares the BER to an error threshold to determine whether soft bits should be generated. If the BER does not exceed the threshold, as determined at block 706, a processor (such as the ECC-based coding/decoding controller 224 of FIG. 2) decodes the data using LDPC without soft bits at block 708. However, if the BER exceeds the threshold, as determined at block 706, traditional soft bits and GAN-based soft bits are generated. That is. at block 710, a processor (such as the ECC-based soft bit controller 228 of FIG. 2) generates traditional soft bits by performing additional senses at voltages above and below the hard bit read threshold and, at block 712, a processor (such as the GAN-based soft bit controller 226 of FIG. 2) generates GAN-based soft bits using a trained GAN (e.g., one of GAN processors 212 of FIG. 2). The operations of blocks 710 and 712 may be performed concurrently. Thereafter, at block 714, a processor (such as the ECC-based coding/decoding controller 224 of FIG. 2) decodes the sensed data using LDPC with traditional soft bits and GAN-based soft bits. (Herein, the traditional soft bits may also be referred to as "additional soft bits" since they are used in this example in addition to the GAN-based soft bits.) For example, the soft information bits generated using GAN (or an ensemble of GANs) may be incorporated with the additional soft bit information in the process of LDPC decoding to improve the correction capabilities of the LDPC decoder. Note that in other examples, depending upon device programming, the processor may perform either block 710 or block 712 but not both.

Although a variety of GAN architectures can be used, the super resolution tasks of SRGAN are not exploited in the generation of the GAN-based soft bits. Rather, GAN tasks pertaining to the standard GAN reconstruction of noisy images (for example) are exploited. That is, the target of the GAN of block 712 is to "clean" a noisy image from NAND-related noises (e.g. programming-noise/data retention (DR)-noise etc.), where exact reconstruction of an image is not needed but rather only a partial reconstruction is performed to remove noise. As will be explained below, the GAN-based soft bits are derived therefrom.

Note that in these examples. when image data is stored into the NVM array, it is encoded using an LDPC process that generates codewords that include the "message" (i.e., the bits representing a particular pixel) in a portion of the codeword and include various error detection and correction bits for use by LDPC in another portion of the codeword. In this manner, the bits of the pixels of the image are persevered so they can be read without LDPC error correction. As such, codewords can be read from memory to first obtain just the stored image (which may have various errors due to bit flips), which can be applied to a GAN to generate the GAN-based soft bits, and then the entire codeword can be applied to LDPC decoder along with the GAN-based soft bit information to error correct the image.

The overall procedure includes several stages, as follows. The initial stage (Stage 0) is performed off-line by a host processor. The other stages are performed by a DSD.

Stage 0—Initial Off-line Training:
   A selected GAN is trained on a large collection of data samples (e.g. images), preferably training set data samples all taken from a unified distribution (for example cartoon movies/nature movies/family photos etc.)). The cost function of the GAN is configured to include a penalty term for a number of original bit flips/pixels flips to encourage the GAN model to provide a (partially) reconstructed image which preserves much of the original data (or at least hints of the original data). In this regard, it is advantageous that the reconstructed image is not significantly different from the original. Hence, the total number of bit flips may be restricted or limited to some maximum number). This is done so the GAN only flips bits when it has high confidence the bit needs to be flipped. The GAN thus also has high confidence that bits that are not flipped are correct. The trained GAN is loaded into the DSD.

Stage 1—GAN inference:
   In use, an initial image (previously stored in the NVM array as codewords encoded using an encoding matrix (M)) is read by the SSD controller of the DSD from the NVM array by reading the codewords and extracting the bits that represent the pixels of the image. This initial image is then applied to the trained GAN to allow the generator of the GAN to perform inference operations on the initial image to generate a partially reconstructed modified image. Note that if the image data is stored in an encrypted or scrambled form, then the data should be unencrypted or unscrambled before it is applied to the GAN so that the GAN receives a coherent image.

Stage 2—Calculate similarity-scores matrix:
   The GAN outcome (i.e., modified image from Stage 1) is compared to the initial image read from the NVM array and a dissimilarity matrix (with dimensions of the original image) is generated to represent the visual differences therebetween (e.g., at a pixel level or group of pixels). For example, a group of pixels that are significantly changed between the original image read from the memory and the GAN-produced reconstructed image are marked with a high dissimilarity score. whereas a group of pixels that are not significantly changed receive a low dissimilarity score. A variety of methods may be used to set an image-similarity-metric (i.e., the dissimilarity scores between the original image and the GAN-reconstructed image), such as Root-Mean-Square-Error (RMSE), Peak Signal-to-Noise-Ratio (PSNR), Structural-Similarity-Index (SSIM), Feature-Based-Similarity-Index (FSIM), etc. The dissimilarity scores of the dissimilarity matric represent the GAN-based soft bit information.

Stage 3—Map similarity scores to original codeword:
   The resulting dissimilarity-matrix is mapped into the bit placement within the relevant codewords of the initial image. The mapping between pixels (or groups of pixels) into codeword bits is computed by the SSD controller based on the encoding matrix M used to initially encode the data.

Stage 4—Allocate soft bits/tune LLR for relevant bits:
   LLR values are obtained for all codeword bits and the LLR values that have high-dissimilarity grades (scores) are reduced to indicate to the LDPC decoder that those bits within the image are less reliable. e.g., due to noise in the NVM array.

Stage 5—LDPC error correction:
   The codewords of the image are error corrected using LDPC based on the adjusted LLR values (thereby enabling the GAN-based soft bit information—i.e., the dissimilarity scores—to aid in the decoding to make the decoding more accurate and efficient). As discussed above, the number of bits flips by the GAN may be limited to preserve much of the original image, and this has the effect of discouraging the LDPC from flipping bits during error correction that the GAN has high confidence are correct during Stage 5. Note that the LDPC can also use otherwise standard soft bits obtained by performing additional sensing to above and below a hard read voltage.

Figure 8:
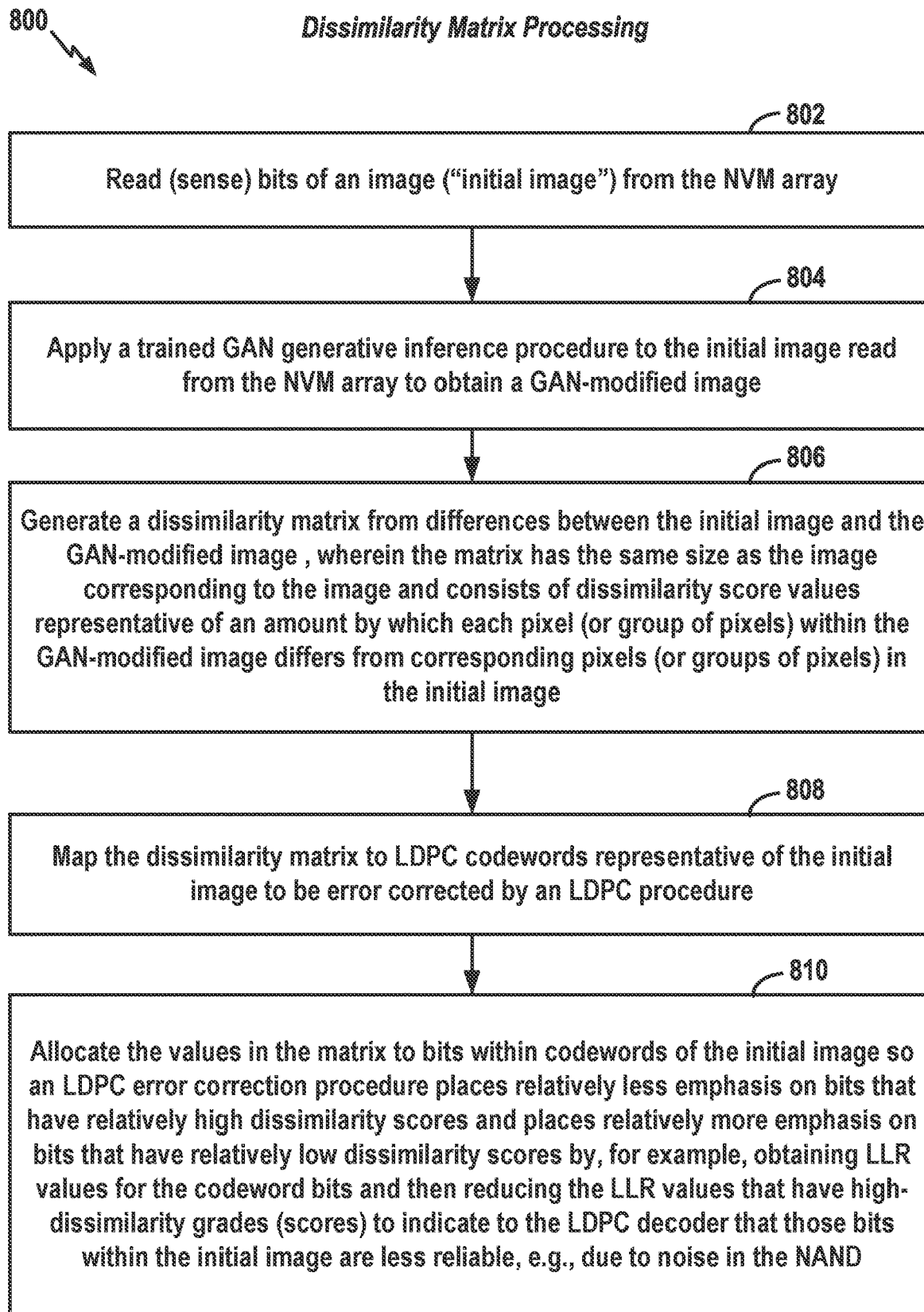
FIG. 8 illustrates features of an exemplary method for dissimilarity matrix processing, in accordance with aspects of the disclosure.

FIG. 8 is a flowchart illustrating dissimilarity matrix processing to generate the GAN-based soft bit information. At block 802, the SSD controller reads (senses) image data from the NVM array that was previously stored using codewords to be error corrected by an LDPC procedure. As discussed above, at this point the SSD controller reads only the bits of codewords that correspond to pixels of the image and does not attempt LDPC error correction. At block 804, the SSD controller (e.g., GAN-based soft bit controller 226 of FIG. 2) applies a trained GAN generative inference procedure to the initial image read from the GAN memory partition to obtain a GAN-modified image, i.e. a reconstructed version of the image in which some bits are flipped by the GAN. At block 806, the SSD controller generates a dissimilarity matrix from differences between the initial image and the GAN-modified image, wherein the matrix has the same size as the image and consists of dissimilarity score values representative of an amount by which each pixel (or group of pixels) within the GAN-modified image differs from corresponding pixels (or groups of pixels) in the initial image. At block 808, the SSD controller maps the dissimilarity matrix to the codewords of the initial image to be error corrected using LDPC. At block 810, the SSD controller allocates the values in the matrix to bits within the codewords of the initial image so the LDPC procedure (e.g., performed by ECC-based coder/decoder 224 of FIG. 2) places relatively less emphasis on bits that have relatively high dissimilarity scores and places relatively more emphasis on bits that have relatively low dissimilarity scores by, e.g., obtaining LLR values for the codeword bits and then reducing the LLR values that have high-dissimilarity grades (scores) to indicate to the LDPC decoder that those bits within the initial image are less reliable, e.g., due to noise in the NAND. As already explained, when LDPC is the applied to the codewords of the image, the LDPC may also use traditional soft bits to further enhance is error correction capabilities.

In some examples, the optimal LLR values that are used for LDPC decoder initialization are a function of the underlying memory error model having bins r as follows:

$$E_r = \text{number or erronuous bits read in bin } r;$$
$$C_r = \text{number of bits read in bin } r$$
$$|LLR_r| = \log_2 \frac{1 - BER_r}{BER_r} = \log_2 \frac{C_r - E_r}{E_r}$$

where $BER_r = E_r/C_r$. That is, LLR can be computed from BER, which in turn can be computed from $C_r$ and $E_r$, as shown.

Using the techniques, and depending on the particular embodiment, improved correction capabilities for GAN-assisted domains can be achieved. A reduction in uncorrectable ECC (UECC) rates and an improvement in device endurance can also be achieved. These correction capabilities can also be exploited to permit reduced parity allocations, hence reducing device costs or increasing the usable memory therein. Moreover, these techniques may be exploited to store data is worn blocks of a drive.

Exemplary GAN-Based Procedures That Exploit Soft Bit Confidence Information

In this section, systems and procedures are described that provide a GAN-based storage system in which GAN or a GAN-like systems use soft bit confidence information during a GAN procedure to correct images. Whereas the procedures of the previous section use a GAN to generate GAN-based soft bit information for subsequent use by an LDPC decoder to improve LDPC processing, the procedures of this section involve generating soft bit information to be applied to a GAN to improve GAN processing. The soft information applied may be generated by traditional means (e.g., soft bits obtained from multiple senses around a hard read threshold) and/or by running two or more GANs in parallel to identify bits that are flipped by some GANs but not other GANs (and hence are less reliable and have lower confidence) as opposed to bits that are not flipped among the GANs (and hence are more reliable and have higher confidence).

In a GAN, each pixel is usually represented by some number of bits (e.g., 8 or 16). The bits represent the color of the pixel. Herein, procedures are described that increase the number of bits per pixel by adding bits that encode the reliability (confidence) of the pixel. Reliability may be quantized using LLR or similar metrics. In one example, a pixel may include a first set of (standard) bits that specify the color of the pixel and a second set of (added) bits that quantify the reliability of the first set of bits. For example, reliability may be quantized on a scale from 1 to 64 with 64 indicating a maximum reliability LLR. In a specific example, the first set of bits may indicate the pixel has a pure red color (e.g., #FF0000 in hexadecimal) and the second set of bits may indicate a reliability of 64 (i.e., the system is very confident that the pixel indeed corresponds to a pure red color). In another specific example, the first set of bits may also indicate the pixel has a pure red color but the second set of bits may indicate a reliability of 1 (e.g., a relatively poor reliability).

In some examples, maximum reliability corresponds to the case where all the "physical soft bits" agree on the bit values of the pixel, i.e., the soft bits sensed from the NVM are such that an LDPC procedure would find high confidence in the bits. (Herein, the term "physical soft bits" refers to soft bits read from the NVM using voltages that differ from the hard read voltage. They are physical in the sense that an actual sensing operation is performed on the physical memory to obtain the value.) On other hand, minimum reliability corresponds to the case where the physical soft bit information indicates that the hard bits were read close to the read voltage, i.e., the physical soft bits are such that an LDPC procedure would find low confidence in the bits.

In another example, maximum reliability corresponds to the case where a set or ensemble of GANs agree that none of the bits of the pixel should be flipped during a GAN-based reconstruction of the image that includes the pixel, whereas minimum reliability corresponds to the case where the set or ensemble of GANs do not agree on whether the bits of the pixel should be flipped, e.g., half the GANs flipped the bits and the other half did not. (Herein, a soft bit derived by comparing GAN outputs is not regarded as a "physical soft bit" since it was not obtained directly from the memory as with physical soft bits). Note that when multiple GANs are used, each GAN may be referred to as a "layer" of the overall GAN.

Hence, in some examples two or more GANs are used to process image data and the output of the GANs is compared to identify pixels that differ. The bits within the differing pixels are deemed to be lower confidence bits and that information may be applied during a final reconstruction of the image by a GAN trained or configured to use the confidence information.

Thus, the reliability (confidence) in the bits of pixels of an image can be quantized and encoded in various different ways. For a particular scheme, a GAN can be configured to process pixel data that incorporates the reliability information to take that information into account while reconstructing images so that pixels with high confidence are preserved by the GAN, while pixels with low confidence may be changed. Since low confidence pixels are more likely corrupted by noise and high confidence pixels are less likely corrupted by noise, the GAN will then reconstruct the image while correcting for noise to produce a sharper image. In one example, the GAN extracts the extra bits of the pixel that encode the reliability and uses those bits as a weight applied to the pixel during image reconstruction.

In yet another example, the processor may be provided with a supervisory function to control the operation of two GANs based on "valley bits" with the GANs controlled to only modify pixels during image reconstruction that have valley bits. As will be explained below, valley bits are bits that have low confidence because they tend to flip under a slight change in a read voltage. The supervisory function iteratively applies image data read at different voltages to the two GANs until the results of the two GANs converge on the same (or similar) output image, which is then used as the reconstructed output image.

In still other examples, the supervisory function can iteratively apply data to an ECC and a GAN with output from the GAN fed back into the ECC. In yet other examples, depending on the data, the supervisory function can apply to other inference-based procedures or engines or rules-based procedures or engines, such as spell checkers, auto-correct, predictive text models, and AI. (Herein, a rules-based procedure is one that applies specified rules to generate outputs; whereas an inference-based procedure, such as AI, infers results from a collection of data using, e.g., a neural network, and generates outputs based on the results of the inference.) In some examples, the supervisory and iteration procedures or topologies described herein may be applied using any of a variety of means of determining which bits to flip (or un-flip) within data (or means for inferring or means for guessing, etc.). These inference or rules-based engines may be used with GANs in parallel, or with one another, to lend confidence to various data correction procedures.

Figure 9:
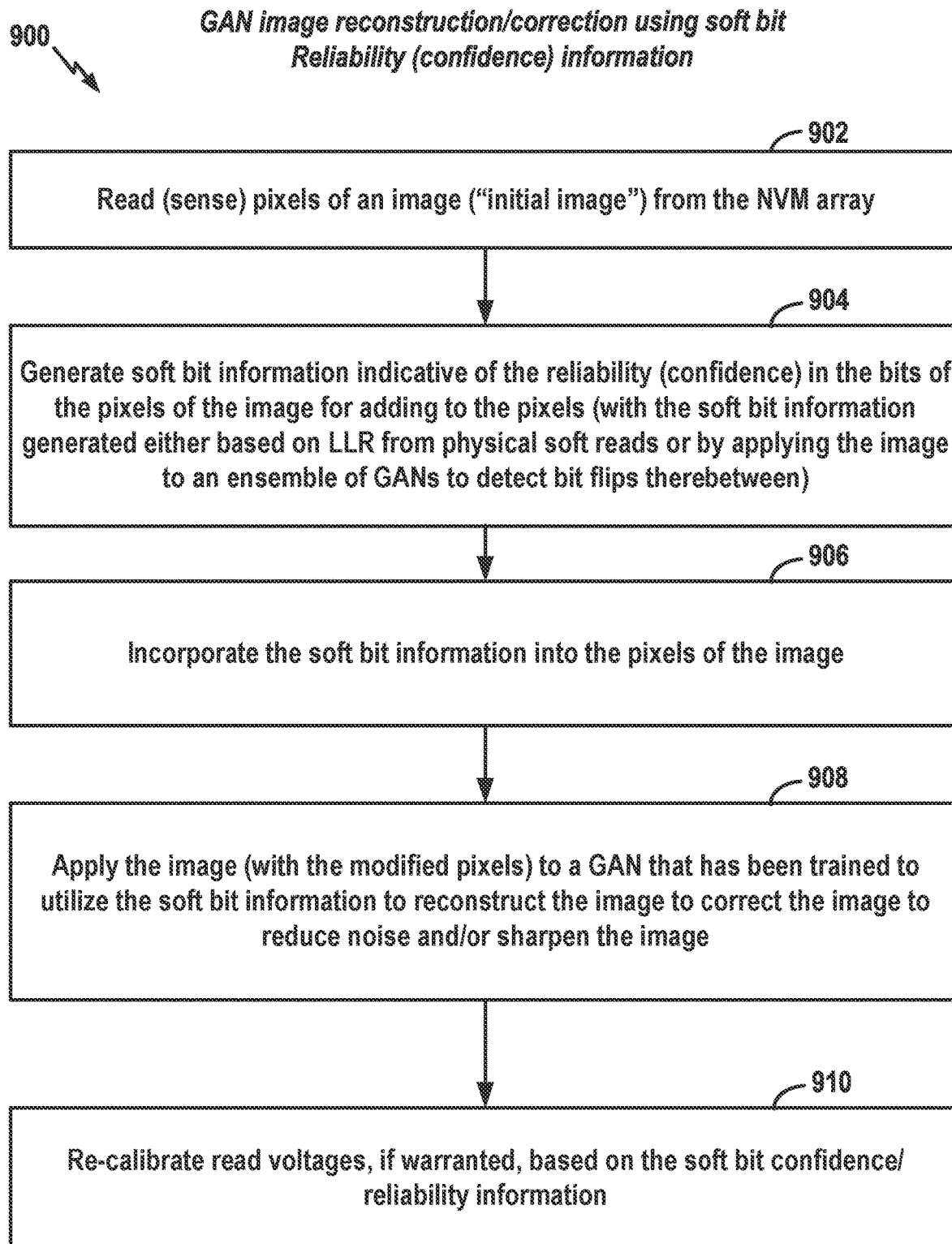
FIG. 9 illustrates features of an exemplary method for using GAN-based soft bit confidence information, in accordance with aspects of the disclosure.

FIG. 9 is a flowchart providing an overview of a method for GAN image reconstruction (correction) using soft bit reliability information. At block 902, a processor (such as the GAN-based coding/decoding controller 222 of FIG. 2) reads (senses) the pixels of an image from an NVM array, e.g., by sensing using a hard bit read threshold. Note that the image data can be stored in a GAN partition but does not need to be stored in GAN partition and can be stored in otherwise standard NVM (as codewords with parity bits for LDPC error detection and correction, as discussed above). At block 904, the SSD controller generates soft bit information indicative of the reliability (confidence) in the bits of the pixels of the image for adding to the pixels (with the soft bit information generated either based on LLR from physical soft reads or by applying the image to two or more GANs to detect bit flips therebetween, as discussed above). At block 906, the SSD controller incorporates the soft bit information into the pixels of the image. As discussed above, the soft bit information may be added to the bits of a pixel with the additional bits representing the reliability of the other bits of the pixel. At block 908, the SSD controller applies the image (with the modified pixels) to another GAN that has been trained to utilize the soft bit information to reconstruct the image to correct the image to reduce noise and/or sharpen the image. In this manner, a noisy or blurry image can be sharpened by a GAN that has been trained to use the reliability in the GAN inference process to retain pixels that have high read confidence while changing pixels that have low read confidence (and hence are more likely to be corrupted by noise). At block 910, in some examples, the SSD controller also re-calibrates the read voltages, if warranted, based on the soft bit confidence/reliability information. That is, if the soft bit confidence/reliability information obtained at block 904 indicated a relatively high amount of noise (e.g., above some noise threshold) in the images read from the NVM, the read voltages can be re-calibrated in an effort to reduce the noise.

In the following, efficient techniques are described for exploiting low confidence "valley bits" (i.e., bits that flip states when read voltages are adjusted slightly).

Figure 10:
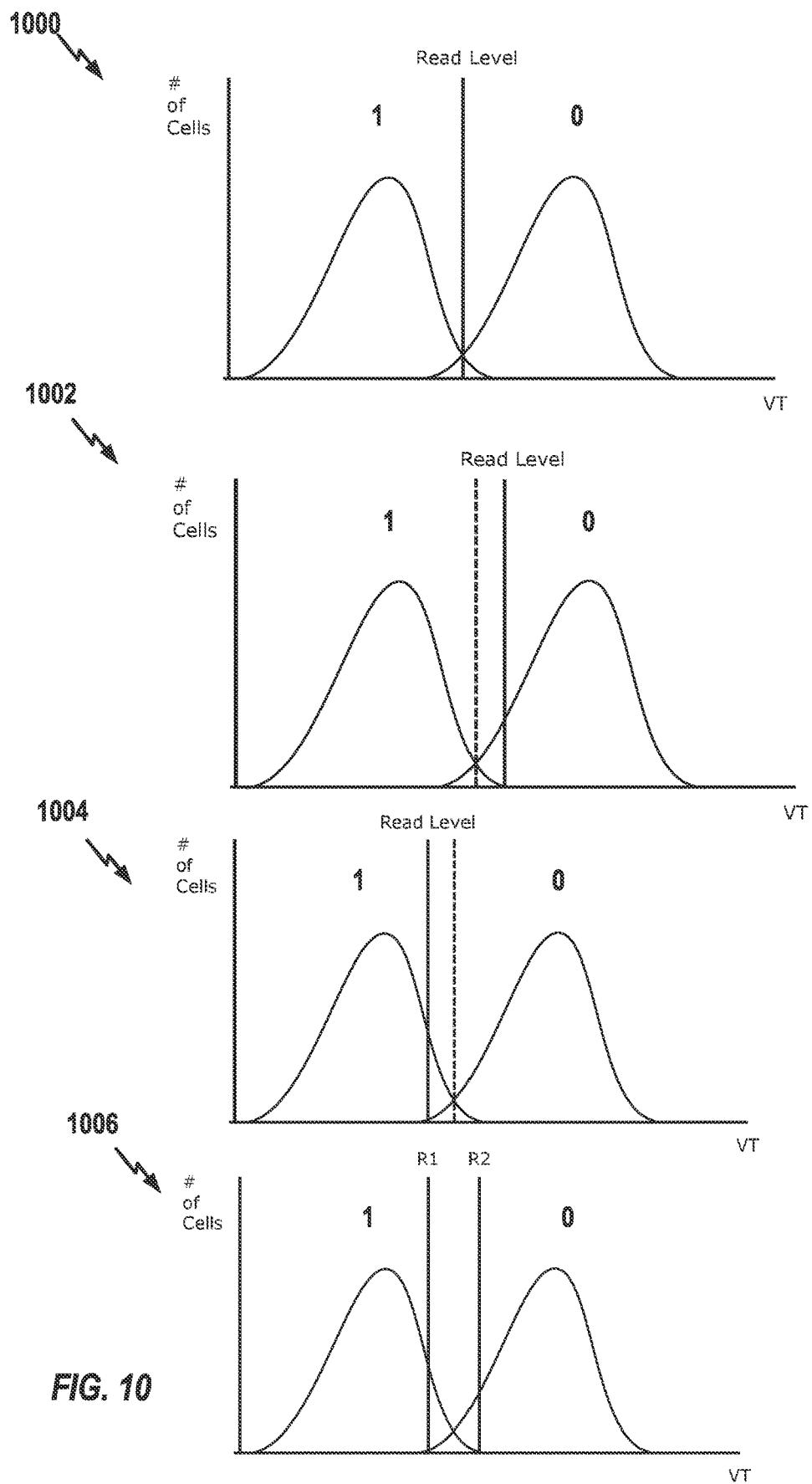
FIG. 10 is a graph illustrating voltage read levels used to define and identify valley bits for use with GAN processing, in accordance with aspects of the disclosure.

FIG. 10 provides a pictorial representation of voltage read levels that may be used to define and identify valley bits. Briefly, a first graph at 1000 shows an example of a two state memory where cells are either zero or one. The X axis represents the voltage threshold (VT) and the Y axis shows the number of cells in the memory at that voltage. Note that there is some overlap between the voltage states. That is, at least some cells meant to represent 1 overlap with some cells meant to represent 0. The read level of graph 1000 is the optimal hard read level because it is directly between the two states. Nevertheless, because of the overlap, some bits near the voltage threshold will be misread and hence are unreliable bits. Graph 1002 shows an example where the read level is increased to a voltage where none of the bits representing 1 will be misread as 0. Yet a greater number of bits meant to be 0 will be misread as 1. Graph 1004 shows the opposite example where the read level is decreased to a voltage where none of the bits representing 0 will be misread as 1. Yet a greater number of bits meant to be 1 will be misread as 0. Finally, graph 1006 shows both of the upper and lower adjusted read levels (R1 and R2). The voltage region between those two levels is referred to herein as the valley region and bits there-between are referred to as valley bits. Bits in the valley region are susceptible to slight changes in the read voltage and easily flip from one voltage state to the other. That is, valley bits flip states when read voltages are adjusted slightly. Note that graph 1006 represents an example where only two senses are made (at R1 and R2). In this regard, if the location (or approximate location) of optimal read level (graph 1000) is known then it is possible to skip the sense at that optimal read level for faster performance at the cost of information and conclude that all bits that changed between the two (R1 and R2) senses are in the valley. regardless of their likelihood of being a zero-to-one or a one-to-zero transition.

Figure 11:
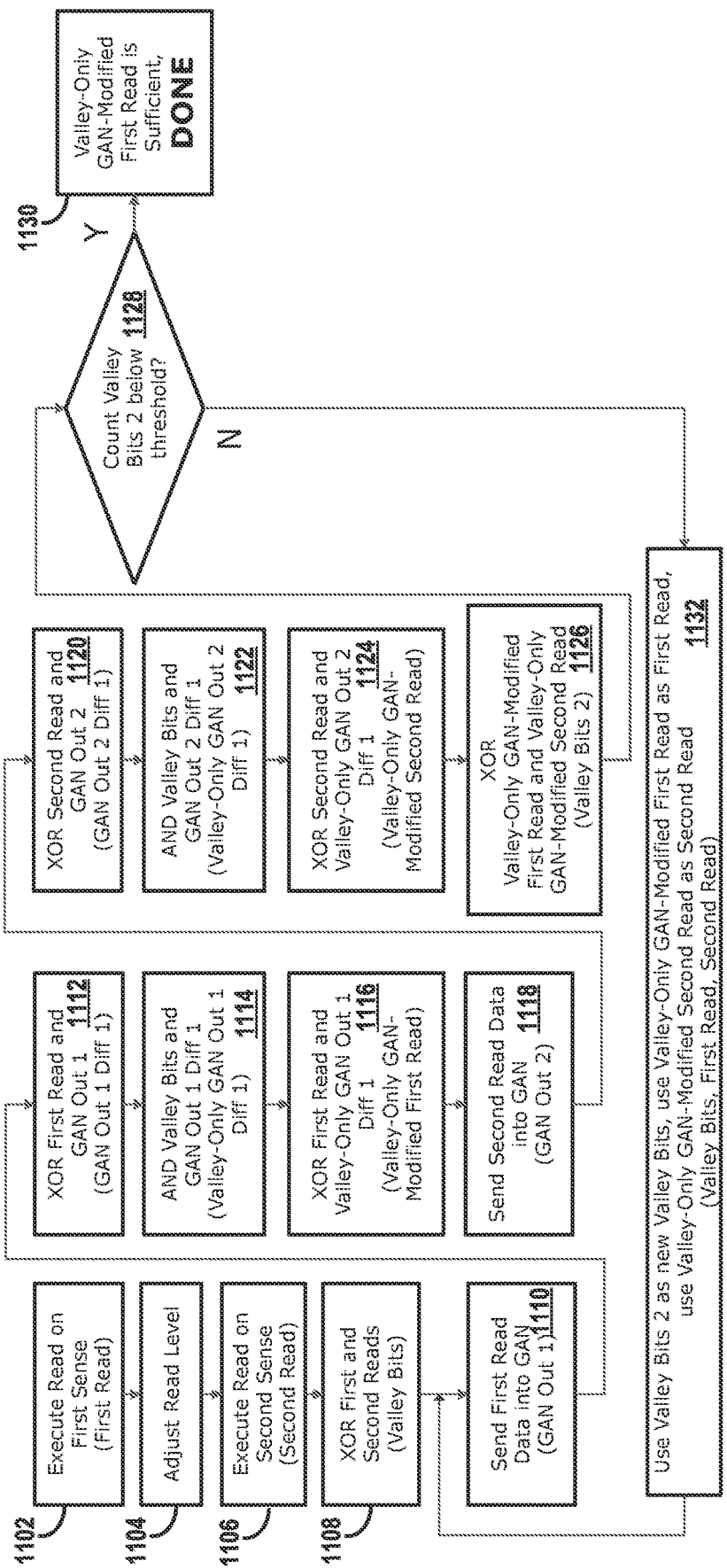
FIG. 11 illustrates a first exemplary method for valley-bit based processing with GANs, in accordance with aspects of the disclosure.

FIG. 11 illustrates GAN processing 1100 for a "two sense" example (e.g., R1 and R2) where various XOR and AND operations are performed on images sensed from an NVM comprising bit strings (sensed at the two voltages, e.g., R1 and R2). The images are applied to separate GANs (GAN 1 and GAN 2) to control the GANs to only modify valley bits until the GANs converge on a reconstructed version of the image. The operations may be performed by a supervisory function of a processor of the SSD controller (such as GAN-based confidence information controller 236 of FIG. 2). At block 1102, the processor Executes a Read on a First Sense (to obtain First Read data), e.g., sense at R1 to obtain a string of bits representing an image that had been stored in the NVM. At block 1104. the processor adjusts the Read Level, e.g., changing it to R2. At block 1106. the processor Executes a Read on a Second Sense (e.g., to obtain Second Read data), e.g., sense at R2 to obtain a second string of bits representing the image. Since the read voltage is different, some of the bits will be flipped from one bit string to the other. As explained above. R1 and R2 can be chosen to be on opposing sides of an optimal read voltage so the flipped bits are valley bits.

At block 1108, the processor XORs the First and Second Read data to obtain the Valley Bits. At block 1110, the processor sends or applies the First Read Data to GAN 1 to obtain reconstructed output data (GAN Out 1 data). At block 1112, the processor XORs the First Read data and the GAN Out 1 data (to obtain GAN Out 1 Diff 1). At block 1114, the processor ANDs the Valley Bits and the GAN Out 1 Diff 1 data (to obtain Valley-Only GAN Out 1 Diff 1). At block 1116, the processor XORs the First Read data and Valley-Only GAN Out 1 Diff 1 data (to obtain Valley-Only GAN-Modified First Read data). At block 1118, the processor sends or applies the Second Read Data to GAN 2 (to obtain GAN Out 2 data).

At block 1120, the processor XORs the Second Read data and GAN Out 2 data (to obtain GAN Out 2 Diff 1 data). At block 1122, the processor ANDs the Valley Bits and the GAN Out 2 Diff 1 data (to obtain Valley-Only GAN Out 2 Diff 1 data). At block 1124, the processor XORs the Second Read data and Valley-Only GAN Out 2 Diff 1 data (to obtain Valley-Only GAN-Modified Second Read data). At block 1126, the processor XORs the Valley-Only GAN-Modified First Read data and Valley-Only GAN-Modified Second Read data (to obtain Valley Bits 2).

At decision block 1128, the processor determines whether a Count of Valley Bits 2 is below a (predetermined or adaptively set) threshold. If so, then at block 1130 the processor determines that the Valley-Only GAN-Modified First Read is Sufficient and no further reads are needed. That is, the Valley-Only GAN-Modified First Read image data represents an acceptable reconstruction of the image read from the memory. Hence, the processing of FIG. 1100 is done. On the other hand, if the Count of Valley Bits 2 is not below the threshold, processing proceeds to block 1132, where the processor resets the data to: use the Valley Bits 2 as new Valley Bits; use the Valley-Only GAN-Modified First Read as new First Read data; and use the Valley-Only GAN-Modified Second Read as a new Second Read data (to obtain new Valley Bits, First Read data, and Second Read data). Processing then returns to block 1110 to repeat the processing of blocks 1112-1128 to determine whether the procedure has now converged on a solution. A maximum number of iterations can be programmed to end the procedure if no convergence is achieved.

Figure 12:
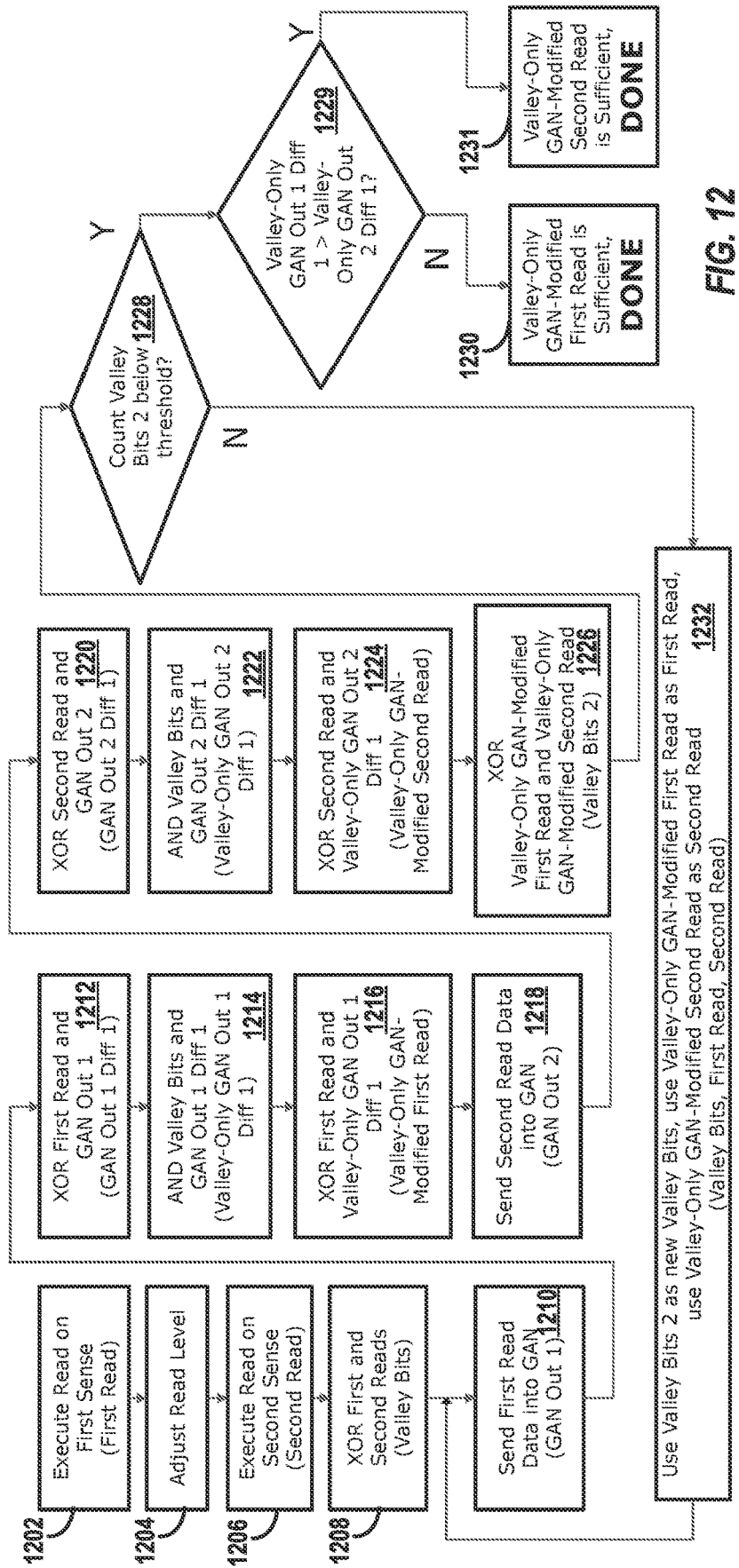
FIG. 12 illustrates a second exemplary method for valley-bit based processing with GANs, in accordance with aspects of the disclosure.

FIG. 12 illustrates GAN processing 1200 for another "two sense" example. The operations again may be performed by a supervisory function of a processor of the SSD controller (such as GAN-based confidence information controller 236 of FIG. 2). At block 1202, the processor Executes a Read on a First Sense (to obtain First Read data), e.g., sense at R1 to obtain a string of bits representing an image that had been stored in the NVM. At block 1204, the processor adjusts the Read Level, e.g., changing it to R2. At block 1206, the processor Executes a Read on Second Sense (e.g., to obtain Second Read data), e.g., sense at R2 to obtain a second string of bits representing the image. As explained above, R1 and R2 can be chosen on opposing sides of an optimal read voltage so the flipped bits are valley bits.

At block 1208, the processor XORs the First and Second Read data to obtain the Valley Bits. At block 1210, the processor sends or applies the First Read Data to GAN 1 to obtain reconstructed output data (GAN Out 1 data). At block 1212, the processor XORs the First Read data and the GAN Out 1 data (to obtain GAN Out 1 Diff 1). At block 1214, the processor ANDs the Valley Bits and the GAN Out 1 Diff 1 data (to obtain Valley-Only GAN Out 1 Diff 1). At block 1216, the processor XORs the First Read data and Valley-Only GAN Out 1 Diff 1 data (to obtain Valley-Only GAN-Modified First Read data). At block 1218, the processor sends or applies the Second Read Data to GAN 2 (to obtain GAN Out 2 data).

At block 1220, the processor XORs the Second Read data and GAN Out 2 data (to obtain GAN Out 2 Diff 1 data). At block 1222, the processor ANDs the Valley Bits and the GAN Out 2 Diff 1 data (to obtain Valley-Only GAN Out 2 Diff 1 data). At block 1224, the processor XORs the Second Read data and Valley-Only GAN Out 2 Diff 1 data (to obtain Valley-Only GAN-Modified Second Read data). At block 1226, the processor XORs the Valley-Only GAN-Modified First Read data and Valley-Only GAN-Modified Second Read data (to obtain Valley Bits 2).

At decision block 1228, the processor determines whether a Count of Valley Bits 2 is below a (predetermined or adaptively set) threshold. If so, then processing proceeds to a second decision block 1229 where the processor determines whether Valley-Only GAN Out 1 Diff 1 is greater than Valley-Only GAN Out 2 Diff 1. If not, then at block 1230 the processor determines that the Valley-Only GAN-Modified First Read is Sufficient and no further reads are needed. Otherwise, at block 1231 the processor determines that the Valley-Only GAN-Modified Second Read is Sufficient and no further reads are needed. In either case, the processing of FIG. 1200 is done. On the other hand, if the Count of Valley Bits 2 is not below the threshold in block 1228, processing proceeds to block 1232, where the processor resets the data to: use the Valley Bits 2 as new Valley Bits; use the Valley-Only GAN-Modified First Read as new First Read data; and use the Valley-Only GAN-Modified Second Read as a new Second Read data (to obtain new Valley Bits, First Read data, and Second Read data). Processing then returns to block 1210 to repeat the processing of blocks 1212-1128 to determine whether the procedure has now converged on a solution. A maximum number of iterations again can be programmed to end the procedure if no convergence is achieved.

Note that once the various GAN-based changes generated during the processing of FIG. 11 or 12 have converged below the threshold, such can be viewed as the result converging (so that further processing is not needed). In FIG. 12, the image that required the fewest number of changes may be taken as the likely correct image to potentially save an iteration by allowing for a larger threshold. Also, the process of FIG. 12 can help address asymmetries that occur in NAND distributions. Note also that each iteration of either process confines the GAN valley bits, i.e. the bits that are suspect. thus further promoting convergence.

Note that it is possible that bits outside of the valley may be in error, and so the final output may be run through a GAN again without restricting the result to only valley bits in an effort to further correct and sharpen the image. Such bits are likely few in number, so as a practical matter, the use of the additional GAN stage might not be justified, but for systems where such errors are more common, the additional GAN stage may be worthwhile. When the additional GAN stage is executed, the number of bits changed (flipped) in that additional stage can be counted and compared to a threshold to determine whether the valley needs to be re-calibrated (e.g., whether R1 and R2 need to be adjusted). In some examples, the valley might be too narrow (e.g., R1 and R2 are too close together) and so recalibration of the valley can be beneficial. A count of the valley bits may be used to determine if the valley is not wide enough or if the valley is not properly centered around the optimal read voltage. A valley search can also help to center the middle of the reads in the valley. A larger valley (increasing the distance between the reads) can enable more bits to be in play for the GAN to change. The number of bits thus can indicate that it is worth expanding the valley.

Still further, note that the procedures of FIGS. 11 and 12 treat all transitions as equal, but if a transition is more likely to be a 0->1 (i.e. when dealing with the "left" side of the valley). then only 0->1 changes could be allowed in the difference between the input and output of the GAN, with another iteration performed on that result before counting it as the difference. That is, better correction can be achieved when factoring in the likelihood of a bit to be a zero or a one, rather than just having an elevated likelihood of an error as compared to most other bits. Note also that with multiple GANs, portions of the process can run in parallel within a single iteration. Note also that XOR operations are usually performed very fast on storage devices since a NAND flash can perform the operations in the latches of the NAND. Also, there are often XOR hardware engines for RAID capability in NAND storage devices and/or SSD/HDD arrays so that such operations do not need to be executed by a host or FW. Although described primarily with reference to examples where the DSD/SSD performs the GAN operations, the operations could instead be performed by a host or some by the host and some by the DSD/SSD.

Still further, although two or three reads are shown in FIGS. 11 and 12, additional read (sense) iterations can be performed. This allows for different tiers of confidence, such as by assigning a likelihood of zero/one to bits that are closer to zero/one, and assigning elevated susceptibility (low reliability) to errors in bits that are in the center of the valley.

Figure 13:
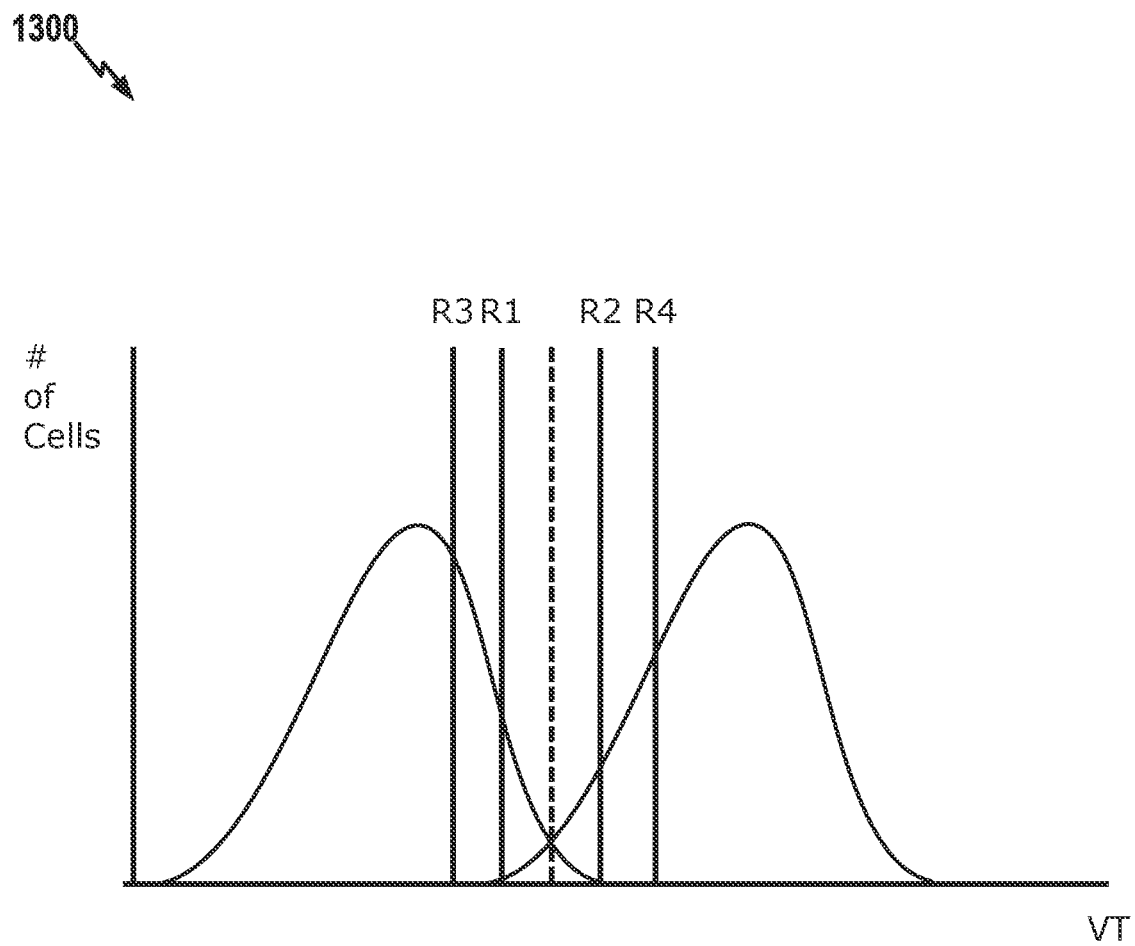
FIG. 13 is a graph illustrating additional voltage read levels that may be used to define and identify valley bits for use with GAN processing, in accordance with aspects of the disclosure.

FIG. 13 provides a pictorial representation of additional voltage read levels (at R3 and R4). As explained, this allows for different tiers of confidence. Bits sensed using R3 can be assigned a higher confidence than bits sensed using R1. Bits sensed using R4 can be assigned a higher confidence than bits sensed using R2. The valley between R3 and R4 can be the wider valley noted above, whereas the valley between R1 and R2 is a narrower valley.

Figure 14:
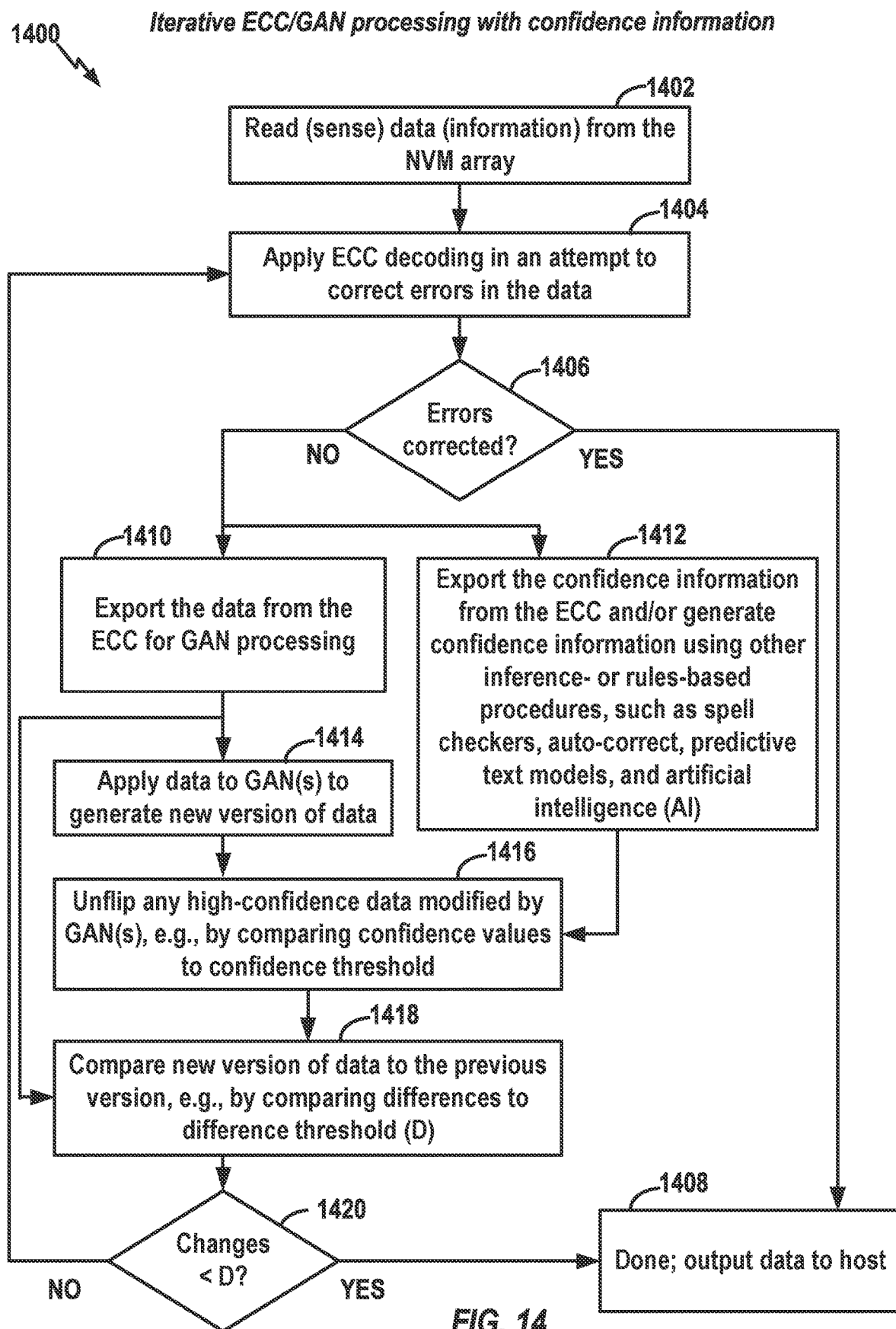
FIG. 14 illustrates features of an exemplary method in which high confidence data is "unflipped" if changed by a GAN, in accordance with aspects of the disclosure.

FIG. 14 illustrates a procedure 1400 in which confidence information is exploited to "unflip" any high confidence data that is changed by a GAN so that only low confidence data is changed by the GAN, while high confidence data is preserved. The procedure also includes an initial ECC decoding operation that can be repeated in a loop along with the GAN procedures until adequate convergence is achieved. The operations again may be controlled by a supervisory function of a processor of the SSD controller. Beginning at block 1402, the processor reads (senses) data (or other information) from the NVM array. At block, 1404, the processor applies the data to an ECC decoder in an attempt to correct errors in the data. During ECC decoding, confidence information of the type discussed above may be generated. If the ECC successfully decodes the data by correcting all (or most) errors, as determined at decision block 1406, processing is complete, as indicated in block 1408. The processor may then output the data to a host or take other action. Note that, at block 1406, the number of remaining errors in the data can be quantified and compared to an error threshold and, if the number of errors is below the threshold, the error correction is deemed satisfactory. In other examples, all errors must be corrected before processing is deemed complete.

If errors remain in the data, then, following decision block 1406, processing proceeds to block 1410 in which the data is exported out of the ECC decoder for processing by one or more GANs. Additionally, any confidence information generated by the ECC is exported out of the ECC decoder at block 1412. Additionally or alternatively, at block 1412, other types of confidence information can be generated using other inference-based or rules-based procedures, such as spell checkers, auto-correct, predictive text models, and AI. Note that these other confidence generating procedures are illustrated in FIG. 14, but they are not limited for use only in the procedure of FIG. 14 but can be exploited in many of the other confidence-based systems and procedures described herein, depending upon the particular type of data. For example, if the data that is being processed is textual data, then text-based procedures such as spell checkers, auto-correct, predictive text models can be exploited.

At block 1414. the processor applied the data exported at block 1410 to one or more GAN(s) to generate a new version of the data. For example, if the data is image data, the GAN may reconstruct a previous version of the image to generate a new version of the image. If the if the data is textual data, and the GAN is configured to process text data, the GAN generates a new version of the text. As explained above, during a GAN procedure, the GAN may attempt to correct (or reconstruct) the data by flipping some of the data, e.g., by flipping individual bits to change pixels, etc. At block 1416, the processor receives the modified data from block 1414 and the confidence information from block 1412 and unflips (e.g., reverts or resets) particular portions of data that had been flipped back to its previous state if the data was high confidence data. This is done so that only low confidence data is changed by the GAN, while high confidence data is preserved. For example, the confidence value associated with a particular portion of data (e.g., a pixel) can be compared to a confidence threshold and, if the confidence exceeds the confidence threshold, the data is deemed to be high confidence data. Otherwise, it is deemed to be low confidence data. Any high confidence data that was modified by the GAN is reset to its prior state.

At block 1418, the processor compares the new version of data (i.e., the output of block 1416) to the previous version (i.e., the output of block 1410) to assess an amount of change. This may be done by quantifying the differences and comparing to a difference threshold (D). For example, the percentage of pixels in the latest version of the image that differ from corresponding pixels in the previous version of the image can be computed and compared to a percentage difference threshold of, e.g., 1%. If the amount of change is not less than the difference threshold (D), as determined at decision block 1420, processing may return to block 1404 so that the latest version of the data can be again applied to the ECC decoder (assuming the data is still in a form that can be processed by the ECC). In this manner, the overall procedure of FIG. 14 can be repeated in a loop to iteratively process the data until it converges by an acceptable amount. Once that convergence is achieved, as determined at decision block 1420 when the latest changes are less than the difference threshold (D), then processing is completed at block 1408. For an image processing example. the data corresponding to the image may be repeatedly applied to the GAN(s) until the latest version is sufficiently similar to the previous version so that no further processing is warranted. In some examples, a maximum number of iterations may be imposed so that, if convergence is not achieved, the process is eventually ended, at which time an error indicator may be sent to the host or other appropriate action may be taken. Note also that in other examples (not shown), if the amount of change is not less than the difference threshold (D) at block 1420, processing returns to 1410 and 1412 rather than to block 1404 for further GAN processing. That is, in some examples, blocks 1404 and 1406 may be bypassed during subsequent iterations of the loop.

Exemplary GAN-Based Procedures That Exploit GAN Ensembles

In this section, systems and procedures are described that apply multiple GANs (e.g., a GAN-ensemble) on read data from an NVM to aggregate the results to achieve better overall correction capability. In some examples, the aggregation may use the median value between different GAN operations to provide a form of "majority rule".

In a first illustrative embodiment, when data is passed to a GAN reconstruction module to assist in a decoding process, the date is sent (e.g., in parallel) to several GANs instead of a single GAN. where each GAN is initiated with different initial conditions. The data is processed by the GANs in parallel and the results of the operation of the several GANs may be aggregated or otherwise combined. The aggregated result may then be sent to the host (or to a next decoding level) as the result of the GAN reconstruction module. The aggregation may be conducted in a variety of different ways. For example, if the input is an image, the median of all the GANs for each of the image's pixels may be calculated to produce the final result. In another example, an average of all pixel values may be calculated, with the minimum and maximum value excluded from the calculation to avoid extremities.

Figure 15:
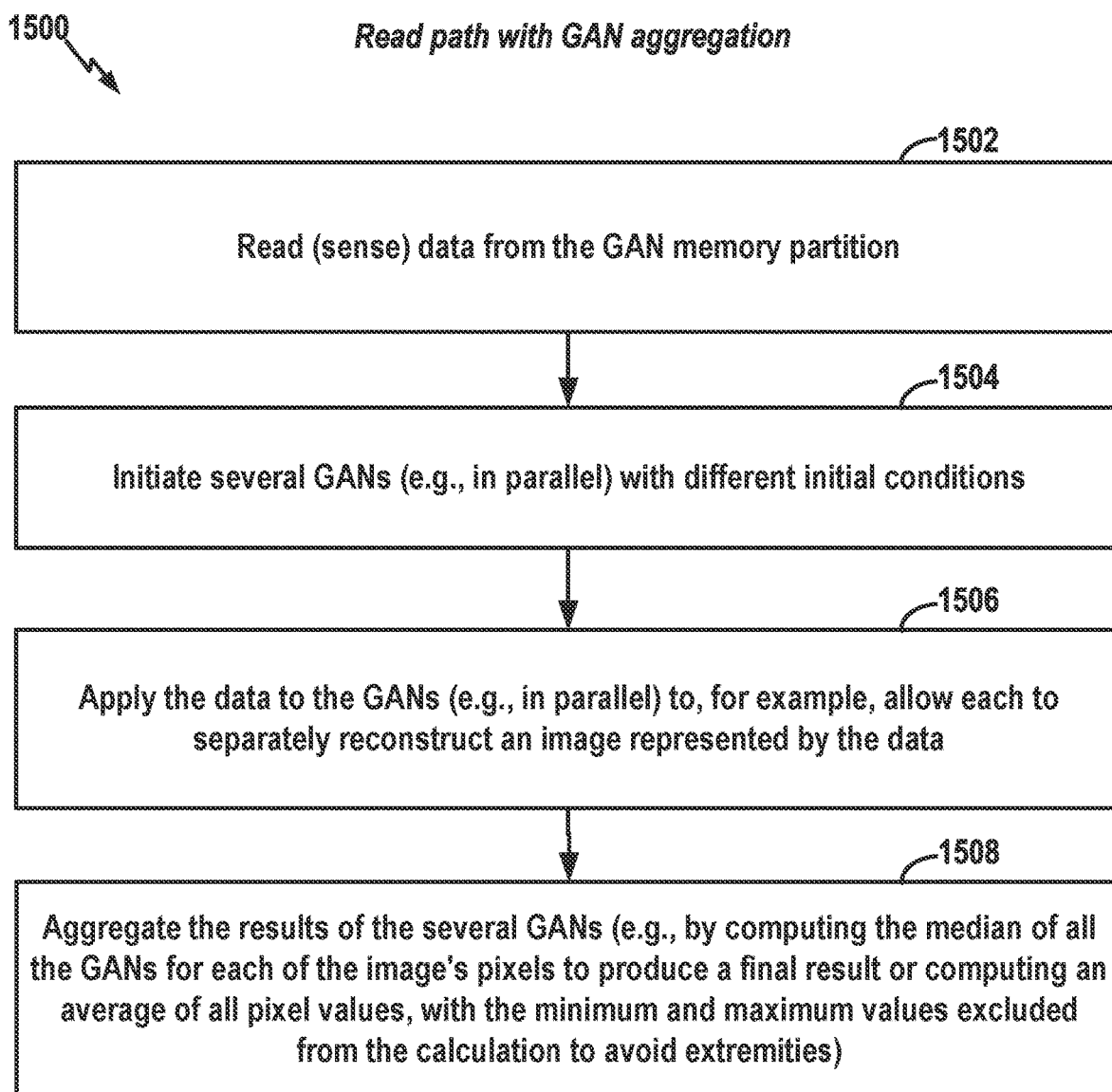
FIG. 15 illustrates features of an exemplary method for GAN outcome aggregation. in accordance with aspects of the disclosure.

FIG. 15 summarizes these features in flow diagram 1500. Briefly, at block 1502, a processor (such as the GAN-based coding/decoding controller 222 of FIG. 2) reads (senses) data from the GAN memory partition (e.g., in response to host read command). At block 1504, the processor initiates several GANs (e.g., in parallel) with different initial conditions and, at block 1506, applies the data to the GANs (e.g., in parallel) to, for example, allow each to separately reconstruct an image represented by the data. At block 1508, the processor aggregates or otherwise combines the results of the several GANs (e.g., by computing the median of all the GANs for each of the image's pixels to produce a final result or computing an average of all pixel values, with the minimum and maximum values excluded from the calculation to avoid extremities.

In another embodiment, the multiple GANs may be trained differently to accommodate different types of defects/noise in the underlying storage medium. The aggregation may be different in this example, since not all the outputs are "equal". The system may identify the source of the noise so that the weighting of the outputs of the different GANs is done differently according to the current noise source. In yet another embodiment, soft information may be generated based on the aggregated results to be fed to an ECC (LDPC) decoder or another GAN layer. The soft information may be generated so that if a bit was flipped in one GAN (or GANs), the reliability of the corresponding bit is reduced. The exact amount of reduced reliability (and its impact on the corresponding LLR) may be developed offline (e.g., using a host) during an initial calibration procedure. However, an online measure (e.g., performed by the DSD) of the impact to the reliability may be used during the decoding itself through a mechanism similar to the one described in U.S. Pat. No. 10,554,227 to Sharon et al, which is incorporated by reference herein. In yet another embodiment, each of the GANs may use data acquired by reading at different voltage levels, as discussed above.

Figure 16:
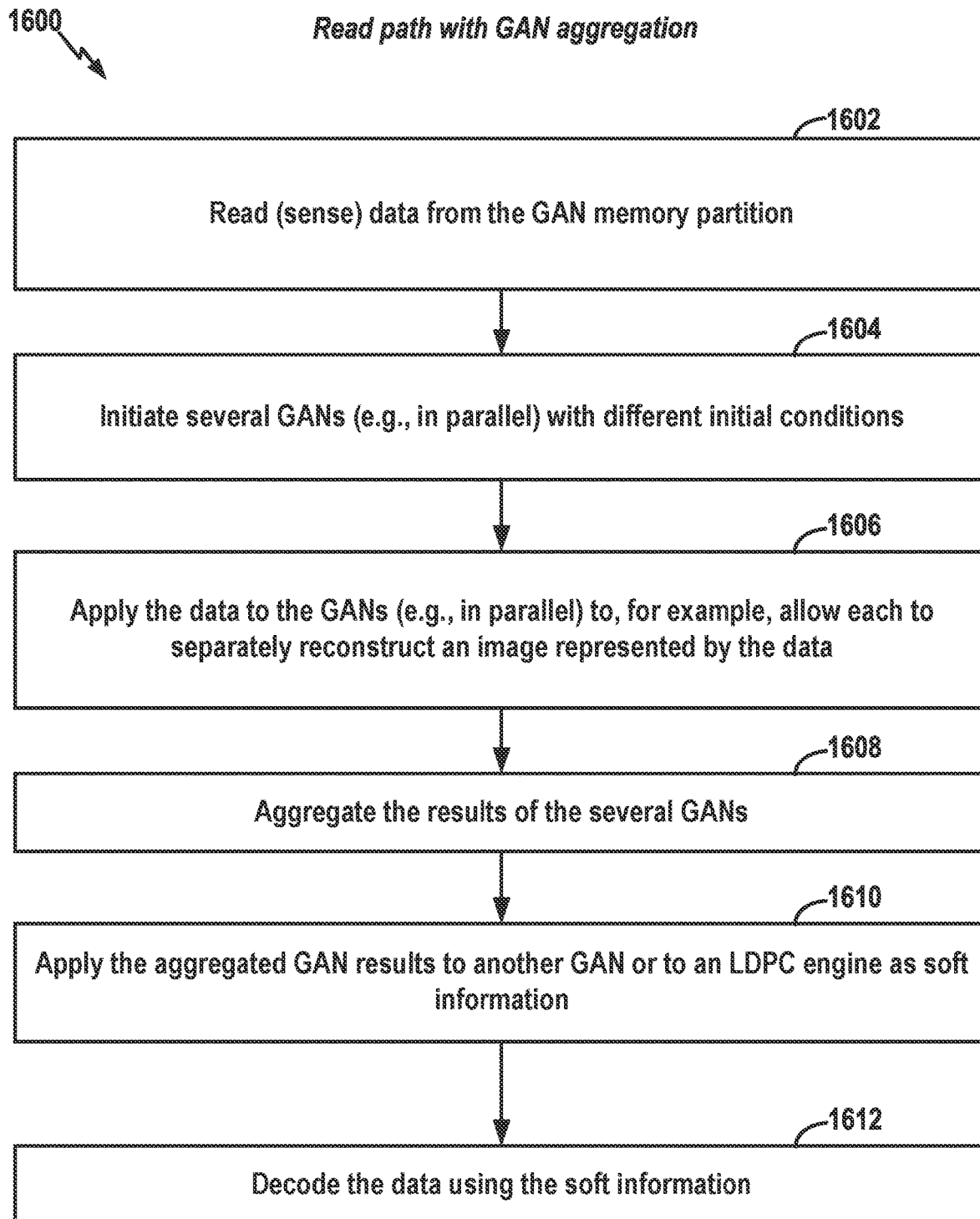
FIG. 16 illustrates additional features of an exemplary method for GAN outcome aggregation, in accordance with aspects of the disclosure.

FIG. 16 summarizes these features in flow diagram 1600. Briefly, at block 1602, a processor (such as the GAN-based coding/decoding controller 222 of FIG. 2) reads (senses) data from the GAN memory partition (e.g., in response to host read command). At block 1604, the processor initiates several GANs (e.g., in parallel) with different initial conditions and, at block 1606, applies the data to the GANs (e.g., in parallel) to, for example, allow each to separately reconstruct an image represented by the data. At block 1608, the processor aggregates the results of the several GANs and then, at block 1610, applies the aggregated GAN results to another GAN or to an LDPC engine as soft information. At block 1612, the processor decodes the data using the soft information. Blocks 1610 and 1612 may be performed, for example, using the techniques described above with reference to FIGS. 7-8.

Generally speaking, the GAN aggregation procedures described in this section may be exploited in any of the GAN procedures described above. For example, wherever a GAN is used, the GAN may be replaced with an ensemble of GANs that aggregate results.

Additional Exemplary Methods and Apparatus

Figure 17:
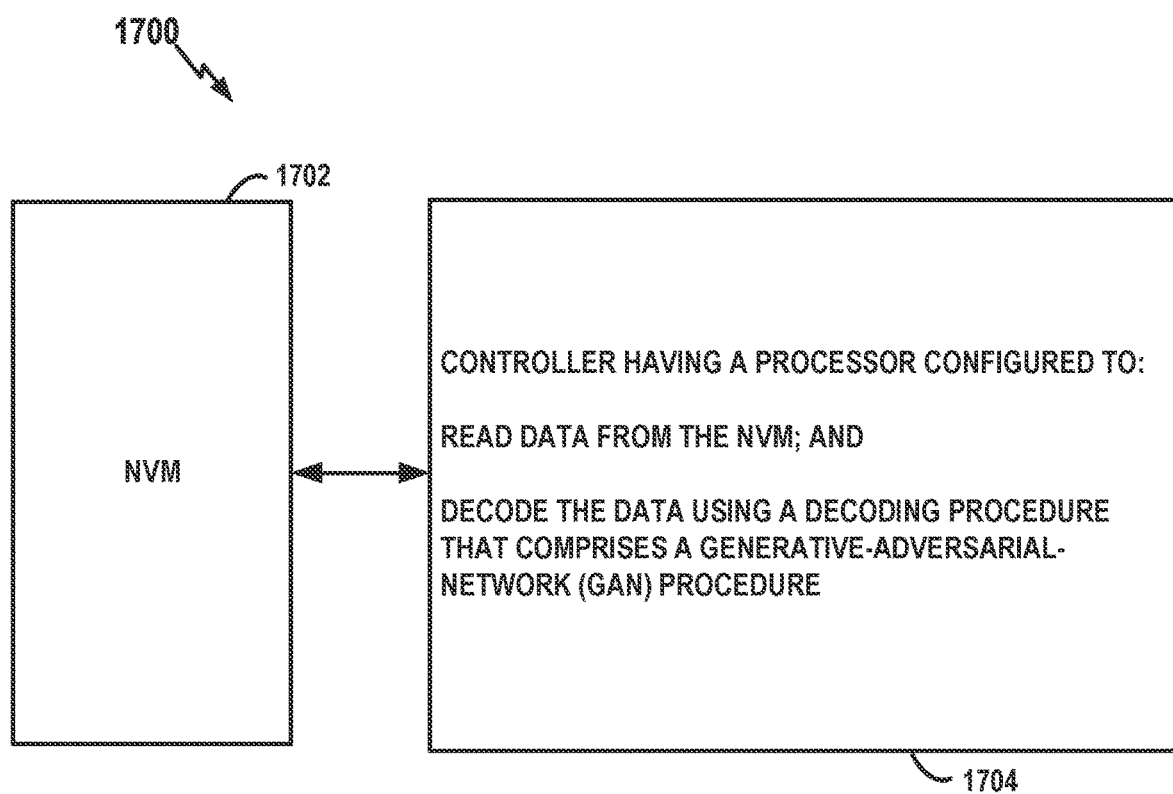
FIG. 17 is a schematic block diagram configuration for an exemplary DSD having an NVM and a controller configured to decode data using a decoding procedure that includes a GAN procedure, in accordance with aspects of the disclosure.

FIG. 17 illustrates an embodiment of an apparatus 1700 configured according to one or more aspects of the disclosure. The apparatus 1700, or components thereof, could embody or be implemented within any suitable apparatus or device capable of performing the operations, such as the DSDs of FIG. 1 or 2. The apparatus 1700 includes an NVM 1702. The apparatus 1700 also includes a data storage controller 1704 that is coupled to the NVM 1702 and has a processor configured to: read data from the NVM 1702; and decode the data using a decoding procedure that comprises a GAN procedure, as described above, for example, in connection with FIGS. 3-6. In some examples, the decoding procedure includes both a GAN procedure and an ECC procedure. The processor is further configured to decode the data by: applying the ECC procedure to the data read from the NVM in an attempt to successfully decode the data using ECC and, in response to a successful decoding of the data using ECC, sending the decoded data to a host; and in response to an unsuccessful decoding of the data using ECC, decoding the data using the GAN procedure and sending the decoded data to the host. In other examples where the decoding procedure includes both a GAN procedure and an ECC procedure, the processor is further configured to decode the data by: applying the ECC procedure to the data read from the NVM to detect but not correct errors; sending the data to the host, in response to a detection of no errors; and, decoding the data, in response to detected errors, using the GAN procedure and send the decoded data to the host.

Figure 18:
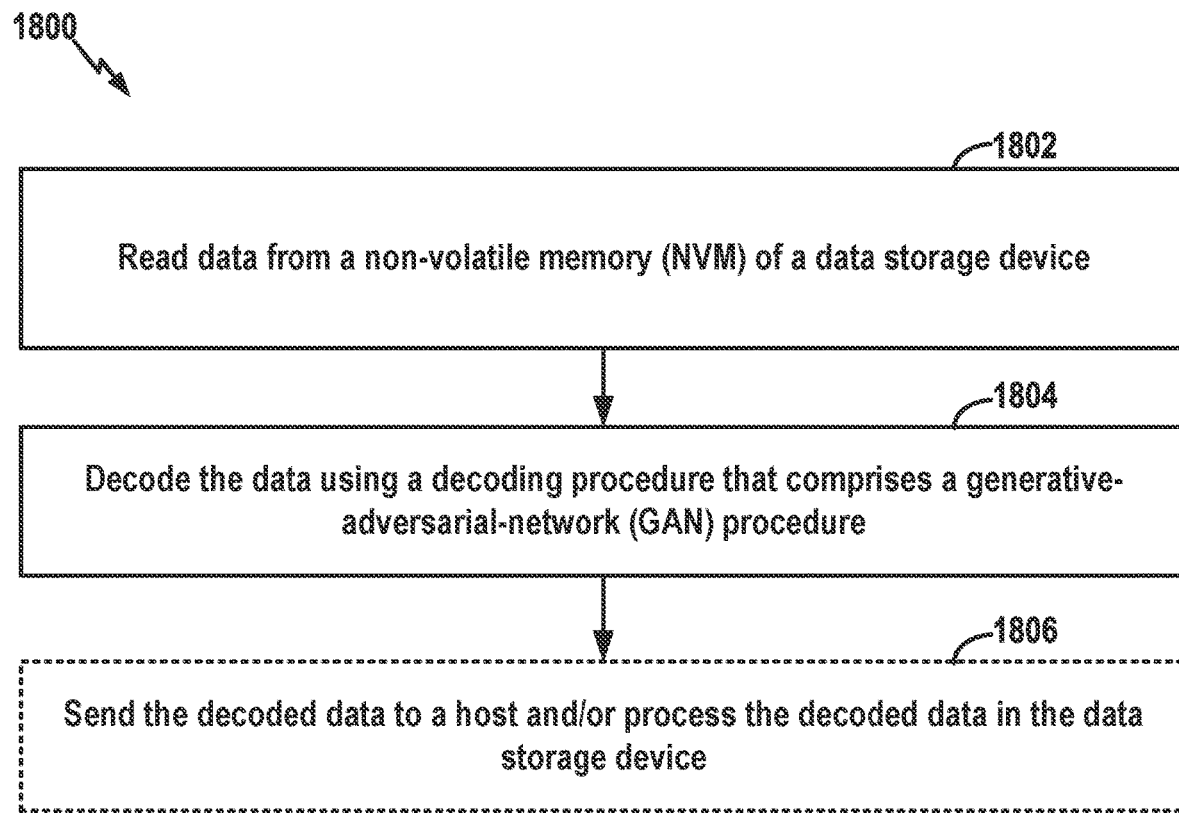
FIG. 18 illustrates an exemplary method for decoding data using a decoding procedure that includes a GAN procedure, in accordance with aspects of the disclosure.

FIG. 18 broadly illustrates a process 1800 in accordance with some aspects of the disclosure. The process 1800 may take place within any suitable apparatus or device capable of performing the operations that is coupled to an NVM, such as the apparatus of FIG. 16 or the DSDs of FIGS. 1 and 2. At block 1802, the device reads data from an NVM of a DSD and, at block 1804, the device decodes the data using a decoding procedure that comprises a GAN procedure. In some examples, at block 1806, the device may optionally send the decoded data to a host and/or process the decoded data in the DSD. In some examples, as with the device of FIG. 16, the decoding procedure includes both a GAN procedure and an ECC procedure. The method may further include decoding the data by: applying the ECC procedure to the data read from the NVM in an attempt to successfully decode the data using ECC and, in response to a successful decoding of the data using ECC, sending the decoded data to a host; and in response to an unsuccessful decoding of the data using ECC, decoding the data using the GAN procedure and sending the decoded data to the host. In other examples where the decoding procedure includes both a GAN procedure and an ECC procedure, the method may further include decoding the data by: applying the ECC procedure to the data read from the NVM to detect but not correct errors; sending the data to the host, in response to a detection of no errors; and, decoding the data, in response to detected errors, using the GAN procedure and send the decoded data to the host.

Figure 19:
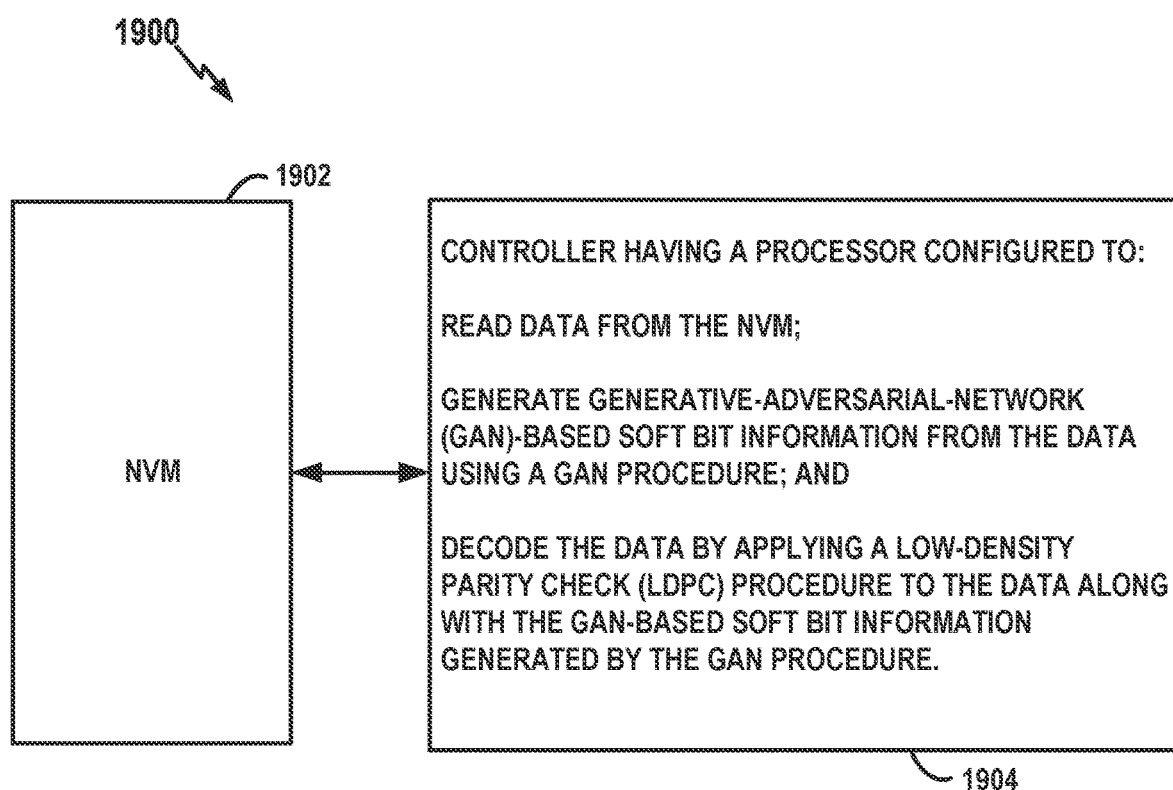
FIG. 19 is a schematic block diagram configuration for an exemplary DSD having an NVM and a controller configured to decode data by applying an LDPC procedure to the data along with GAN-based soft bit information generated by a GAN procedure, in accordance with aspects of the disclosure.

FIG. 19 illustrates an embodiment of an apparatus 1900 configured according to one or more aspects of the disclosure. The apparatus 1900, or components thereof, could embody or be implemented within any suitable apparatus or device capable of performing the operations, such as the DSDs of FIG. 1 or 2. The apparatus 1900 includes an NVM 1902. The apparatus 1900 also includes a data storage controller 1904 that is coupled to the NVM 1902 and has a processor configured to: read data from the NVM 1902; generate GAN-based soft bit information from the data using a GAN procedure; and decode the data by applying a LDPC procedure to the data along with the GAN-based soft bit information generated by the GAN procedure, as described above, for example, in connection with FIGS. 7 and 8. In some examples, the above-described dissimilarity matrix procedures are employed.

Figure 20:
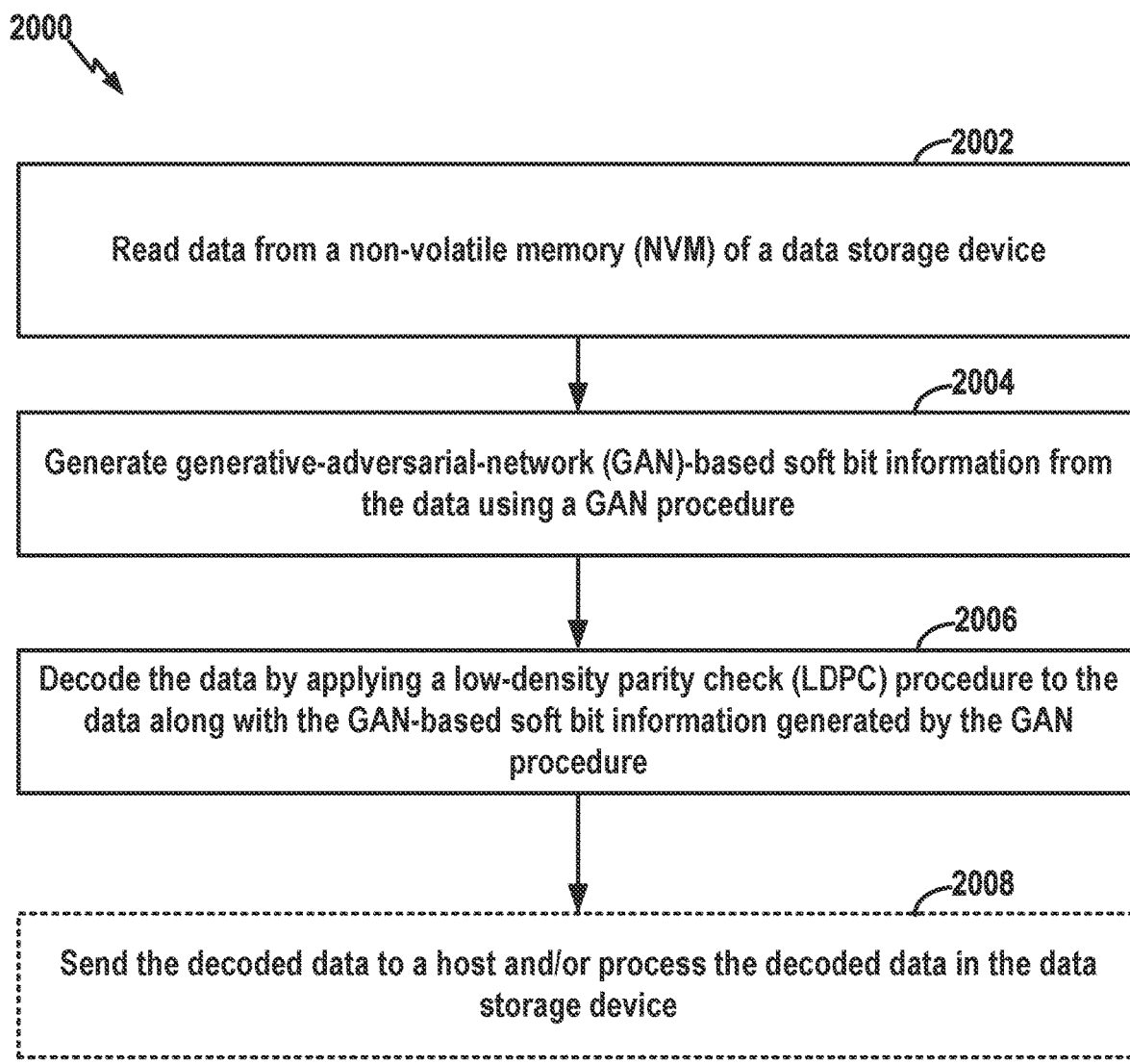
FIG. 20 illustrates an exemplary method for decoding data by applying an LDPC procedure to the data along with GAN-based soft bit information generated by a GAN procedure, in accordance with aspects of the disclosure.

FIG. 20 broadly illustrates a process 2000 in accordance with some aspects of the disclosure. The process 2000 may take place within any suitable apparatus or device capable of performing the operations that is coupled to an NVM, such as the apparatus of FIG. 18 or the DSDs of FIGS. 1 and 2. At block 2002, the device reads data from the NVM. At block 2004, the device generates GAN-based soft bit information from the data using a GAN procedure. At block 2006, the device decodes the data by applying a LDPC procedure to the data along with the GAN-based soft bit information generated by the GAN procedure, as described above, for example, in connection with FIGS. 7 and 8. In some examples, at block 2008, the device may optionally send the decoded data to a host and/or process the decoded data in the DSD. In some examples, the above-described dissimilarity matrix procedures are employed.

Figure 21:
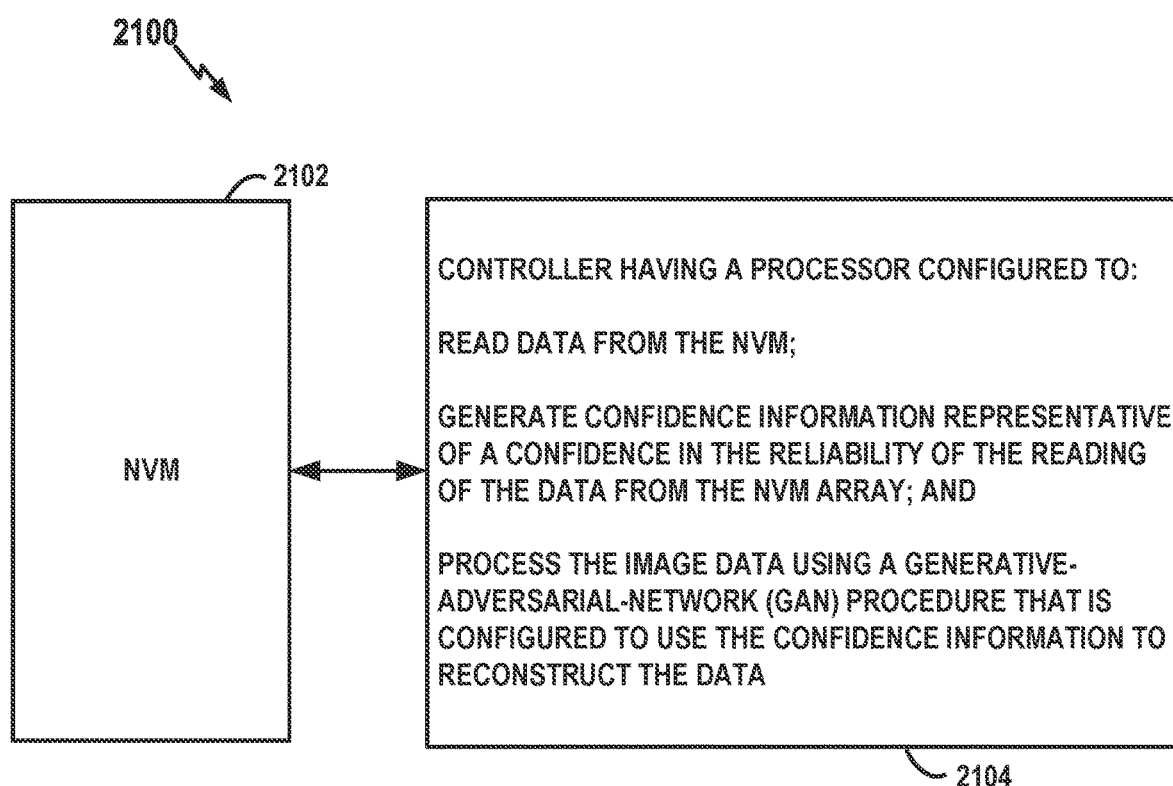
FIG. 21 is a schematic block diagram configuration for an exemplary DSD having an NVM and a controller configured to process data using a GAN procedure that configured to use the confidence information to reconstruct the data, in accordance with aspects of the disclosure.

FIG. 21 illustrates an embodiment of an apparatus 2100 configured according to one or more aspects of the disclosure. The apparatus 2100, or components thereof, could embody or be implemented within any suitable apparatus or device capable of performing the operations, such as the DSDs of FIG. 1 or 2. The apparatus 2100 includes an NVM 2102. The apparatus 2100 also includes a data storage controller 2104 that is coupled to the NVM 2102 and has a processor configured to: read data from the NVM 2102; generate confidence information representative of a confidence in the reliability of the reading of the data from the NVM; and process the data using a GAN procedure that is configured to use the confidence information to reconstruct the data, as described above, for example, in connection with FIGS. 9-16.

Figure 22:
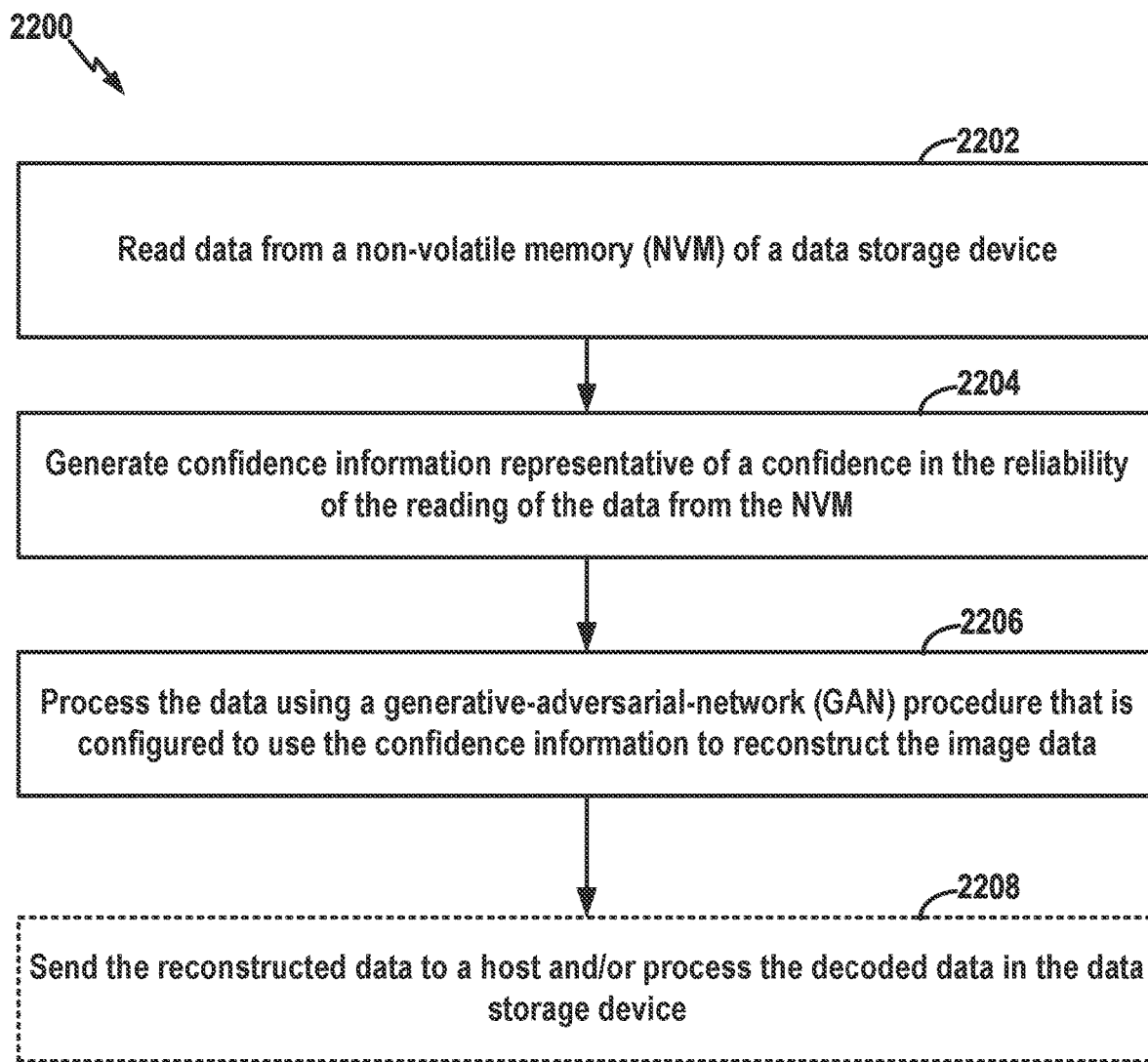
FIG. 22 illustrates an exemplary method for processing data using a GAN procedure configured to use the confidence information to reconstruct the data, in accordance with aspects of the disclosure.

FIG. 22 broadly illustrates a process 2200 in accordance with some aspects of the disclosure. The process 2200 may take place within any suitable apparatus or device capable of performing the operations that is coupled to an NVM, such as the apparatus of FIG. 18 or the DSDs of FIGS. 1 and 2. At block 2202. the device reads data from the NVM. At block 2204. the device generates confidence information representative of a confidence in the reliability of the reading of the data from the NVM. At block 2204, the device processes the data using a GAN procedure that is configured to use the confidence information to reconstruct the data, as described above, for example, in connection with FIGS. 9-16. In some examples. at block 2208, the device may optionally send the reconstructed data to a host and/or process the reconstructed data in the DSD.

Exemplary Apparatus Having an NVM Array With a GAN Partition

Figure 23:
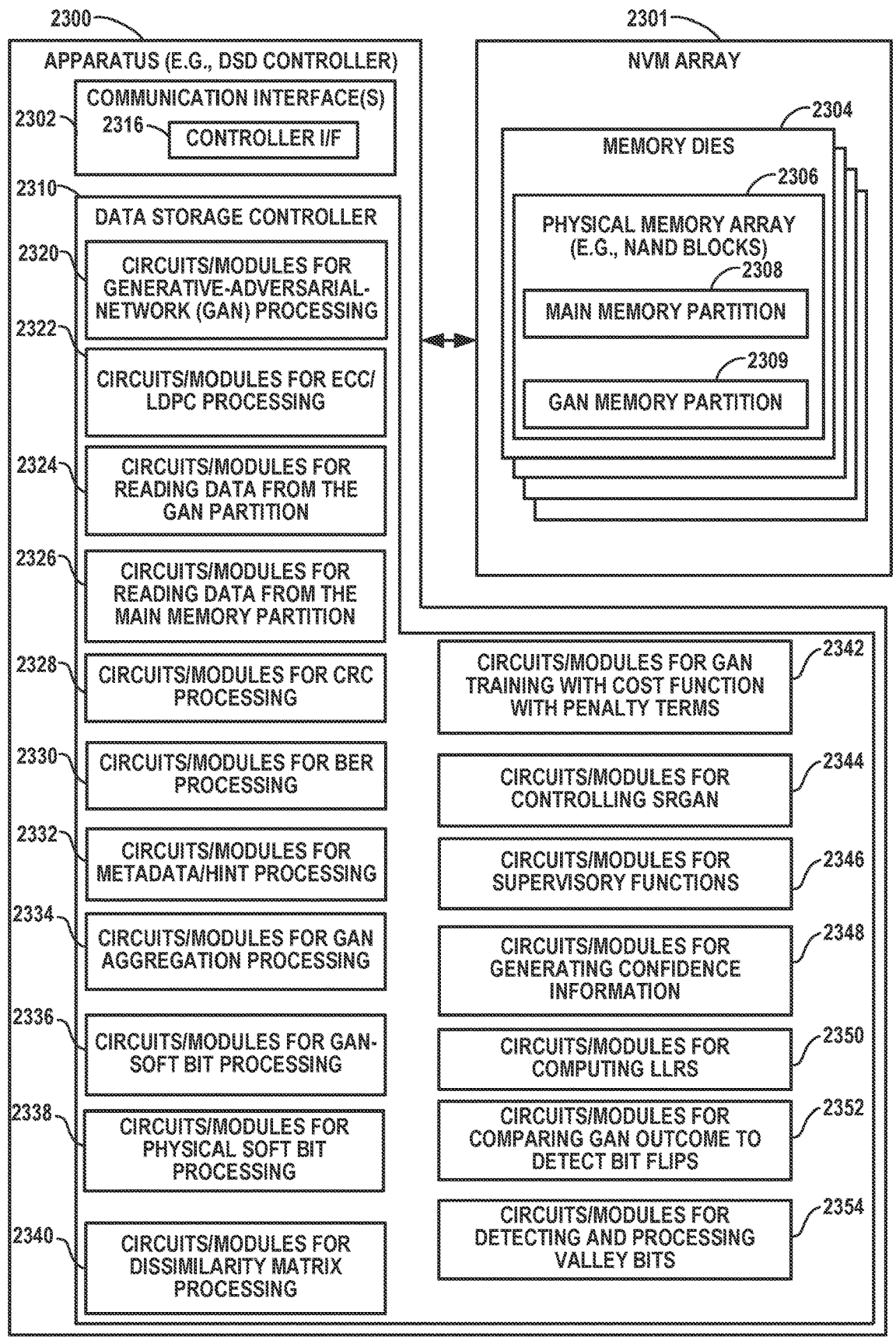
FIG. 23 is a schematic block diagram configuration for an exemplary apparatus such as a DSD having GAN-based features.

FIG. 23 illustrates an embodiment of an apparatus 2300 configured according to one or more aspects of the disclosure. The apparatus 2300, or components thereof, could embody or be implemented within a DSD other type of device that supports data storage. In various implementations, the apparatus 2300, or components thereof, could be a component of a processor, a controller, a computing device, a personal computer, a portable device, or workstation, a server, a personal digital assistant. a digital camera, a digital phone, an entertainment device, a medical device, a self-driving vehicle control device, or any other electronic device that stores, processes, or uses data. In some examples, the apparatus 2300 is a component of a video game system.

The apparatus 2300 is communicatively coupled to an NVM array 2301 that includes one or more memory dies 2304, each of which may include physical memory arrays 2306, e.g. NAND blocks, with at least one of the memory dies including a main memory partition 2308 and a GAN memory partition 2309. The physical memory array 2306 may be communicatively coupled to the apparatus 2300 such that the apparatus 2300 can read or sense information from, and write or program information to, the physical memory array 2306. That is, the physical memory array 2306 can be coupled to circuits of apparatus 2300 so that the physical memory array 2306 are accessible by the circuits of apparatus 2300. Note that not all components of the memory dies are shown. The dies may include, e.g., extra-array processing circuits (e.g. under-the-array or next-to-the-array circuits), as well as input/output components. etc. The connection between the apparatus 2300 and the memory dies 2304 of the NVM array 2301 may include, for example, one or more busses.

The apparatus 2300 includes a communication interface 2302 and a data storage controller 2310. These components can be coupled to and/or placed in electrical communication with one another and with the NVM array 2301 via suitable components. represented generally by connection lines in FIG. 23. Although not shown, other circuits such as timing sources, peripherals, voltage regulators, and power management circuits may be provided, which are well known in the art, and therefore, will not be described any further.

The communication interface 2302 provides a means for communicating with other apparatuses over a transmission medium. In some implementations, the communication interface 2302 includes circuitry and/or programming (e.g., a program) adapted to facilitate the communication of information bi-directionally with respect to one or more devices in a system. In some implementations, the communication interface 2302 may be configured for wire-based communication. For example, the communication interface 2302 could be a bus interface, a send/receive interface, or some other type of signal interface including circuitry for outputting and/or obtaining signals (e.g., outputting signal from and/or receiving signals into an SSD). The communication interface 2302 serves as one example of a means for receiving and/or a means for transmitting.

The data storage controller 2310 include modules and/or circuits are arranged or configured to obtain, process and/or send data, control data access and storage, issue or respond to commands, and control other desired operations. For example, the various modules/circuits may be implemented as one or more processors, one or more controllers, and/or other structures configured to perform functions. According to one or more aspects of the disclosure, the modules/circuits may be adapted to perform the various features, processes, functions, operations and/or routines described herein. For example, the various modules/circuits may be configured to perform the steps, functions, and/or processes described with respect to FIGS. 1-17. Also, in some embodiments, some features of the data storage controller 2310 may be implemented on a memory die 2304 as under-the-array or next-to-the array circuitry.

As used herein, the term "adapted" in relation to the processing modules/circuits may refer to the modules/circuits being one or more of configured, employed, implemented, and/or programmed to perform a particular process, function, operation and/or routine according to various features described herein. The modules/circuits may include a specialized processor, such as an application specific integrated circuit (ASIC) that serves as a means for (e.g., structure for) carrying out any one of the operations described in conjunction with FIGS. 1-21. The modules/circuits serve as an example of a means for processing. In various implementations, the modules/circuits may provide and/or incorporate, at least in part. functionality described above for the components in various embodiments shown.

According to at least one example of the apparatus 2300, the data storage controller 2310 may include circuits/modules 2320 configured for GAN processing, such as GAN-based decoding of data as in FIGS. 3-6 and/or GAN-based reconstruction of data as in FIGS. 9-13. The data storage controller 2310 may also include circuits/modules 2322 configured for ECC/LDPC processing, such as ECC/LDPC-based decoding of data with error correction as in FIGS. 3-6 and FIGS. 9-13. The data storage controller 2310 may also include one or more of: circuits/modules 2324 configured for reading data from the GAN partition 2309; circuits/modules 2326 configured for reading data from the main memory partition 2308; circuits/modules 2328 configured for CRC processing (to, e.g., detect but not correct errors in data); circuits/modules 2330 configured for BER processing, such to estimate BER and compare BER to a threshold to control GAN-based or ECC-based processing; circuits/modules 2332 configured for metadata/hint processing, such as to use metadata to determine a type of data to be processed by a GAN-based procedure; circuits/modules 2334 configured for GAN aggregation processing, as in FIGS. 14-15; circuits/modules 2336 configured for GAN soft bit processing, as in FIGS. 7 and 9; circuits/modules 2338 configured for physical soft bit processing, as in FIG. 9; circuits/modules 2340 configured for dissimilarity matrix processing, as in FIG. 8; circuits/modules 2342 configured for GAN training using cost functions with penalty terms, as discussed above in connection with dissimilarity matrix processing; circuits/modules 2344 configured for SRGAN processing; circuits/modules 2346 configured for performing supervisor functions, as discussed above in connection with FIGS. 11, 12 and 14; circuits/modules 2348 configured for generating confidence information, e.g., physical soft bits or GAN-based soft bits, as described above in connection with FIG. 9 or confidence information from spell checkers, predictive text models, etc.; circuits/modules 2350 configured to compute LLRs; circuits/modules 2352 configured for comparing GAN outputs to detect flipped bits, as discussed above in connection with FIGS. 9, 11 and 12, and to unflip bits as discussed in FIG. 14; and circuits/modules 2354 configured for detecting and processing valley bits, as discussed above in connection with FIGS. 10-13.

In at least some examples, means may be provided for performing the functions illustrated in FIG. 23 and/or other functions illustrated or described herein. For example, the means may include one or more of: means, such as circuits/modules 2320, for GAN processing, such as GAN-based decoding of data as in FIGS. 3-6 and/or GAN-based reconstruction of data as in FIGS. 9-13; means, such as circuits/modules 2322, for ECC/LDPC processing, such as ECC/LDPC-based decoding of data with error correction as in FIGS. 3-6 and FIGS. 9-13; means, such as circuits/modules 2324, for reading data from the GAN partition 2309; means, such as circuits/modules 2326, for reading data from the main memory partition 2308; means, such as circuits/modules 2328, for CRC processing (to, e.g., detect but not correct errors in data); means, such as circuits/modules 2330, for BER processing, such to estimate BER and compare BER to a threshold to control GAN-based or ECC-based processing; means, such as circuits/modules 2332, for metadata/hint processing, such as to use metadata to determine a type of data to be processed by a GAN-based procedure; means, such as circuits/modules 2334, for GAN aggregation processing, as in FIGS. 14-15; means, such as circuits/modules 2336, for GAN soft bit processing, e.g., as in FIGS. 7 and 9; means, such as circuits/modules 2338, for physical soft bit processing, e.g., as in FIG. 9; means, such as circuits/modules 2340, for dissimilarity matrix processing, e.g., as in FIG. 8; means, such as circuits/modules 2342, for GAN training using cost functions with penalty terms, as discussed above in connection with dissimilarity matrix processing; means, such as circuits/modules 2344, for SRGAN processing; means, such as circuits/modules 2346, for performing supervisor functions, e.g., as discussed above in connection with FIGS. 11, 12 and 14; means, such as circuits/modules 2348, for generating confidence information, e.g., physical soft bits or GAN-based soft bits, e.g., as described above in connection with FIG. 9; means, such as circuits/modules 2350, for computing LLRs; means, such as circuits/modules 2352, for comparing GAN outputs to detect flipped bits, e.g., as discussed above in connection with FIGS. 9, 11 and 12 and to unflip bits as in FIG. 14; and means, such as circuits/modules 2354, for detecting and processing valley bits, e.g., as discussed above in connection with FIGS. 10-13.

In yet another aspect of the disclosure, a non-transitory computer-readable medium is provided that bas one or more instructions which when executed by a processing circuit or software module in a DSD controller that causes the controller to perform one or more of the functions or operations listed above.

In at least some examples, software code may be provided for performing the functions illustrated in FIG. 23 and/or other functions illustrated or described herein.

Although described primarily with reference to DSDs having NVM, aspects of the present disclosure can be implemented in other devices such as host computing devices. Moreover, aspects of the present disclosure are not limited to NVM and at least some of the GAN-based features described herein can be applied to data stored in a volatile memory.

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code. programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain. process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NAND flash memory, such as 3D NAND flash memory. Semiconductor memory devices include volatile memory devices, such as DRAM or SRAM devices, NVM devices, such as ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices. programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example. described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention. these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B. A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage device, comprising:
   a non-volatile memory (NVM);
   a data storage controller coupled to the NVM, the data storage controller comprising one or more processors configured, individually or in combination, to:
   read pixels representing an image from the NVM,
   generate confidence information representative of a confidence in the reliability of the reading of the pixels from the NVM, the confidence information comprising a set of bits that quantify the reliability within a range of reliability values that comprises at least three different reliability values;
   modify the pixels read from the NVM to each include the set of bits that represent the confidence information; and reconstruct the image with the modified pixels by processing the data using a generative-adversarial-network (GAN) procedure that is configured to reconstruct images comprising pixels that include the set of bits that represent the confidence information.

2. The data storage device of claim 1, wherein the one or more processors are further configured to generate the confidence information by being further configured to generate soft bits.

3. The data storage device of claim 2, wherein the one or more processors are further configured to generate the soft bits by being further configured to determine a Log Likelihood Ratio (LLR) from the pixels of the read data.

4. The data storage device of claim 1, wherein the one or more processors are further configured to generate the confidence information by being further configured to:
perform a preliminary reconstruction of the image using a plurality of different GAN procedures without using any confidence information; and
determine whether the plurality of different GAN procedures yielded the same reconstructed image as one another.

5. The data storage device of claim 4, wherein the one or more processors are further configured to determine whether the plurality of different GAN procedures yielded the same reconstructed image by being further configured to detect flipped bits among the pixels of the reconstructed image output from the different GAN procedures.

6. The data storage device of claim 4, wherein the one or more processors are further configured to quantify the confidence by being further configured to count a number of flipped bits.

7. The data storage device of claim 4, wherein the one or more processors are further configured to perform the preliminary reconstruction of the data by being further configured to execute the plurality of different GAN procedures in parallel.

8. The data storage device of claim 1, wherein the one or more processors are further configured to generate the confidence information by being further configured to:
perform first and second senses of bits of the data at first and second different read voltages to obtain first and second reads of the data;
identify a set of valley bits within the first and second reads of the data; and
generate the confidence information from the set of valley bits.

9. The data storage device of claim 1, wherein the one or more processors are further configured to adjust read voltages based on the confidence information.

10. The data storage device of claim 1, wherein the data storage controller further comprises a plurality of GAN processors configured to perform separate GAN procedures to reconstruct the image with the pixels that include the confidence information and to combine results of the separate GAN procedures.

11. The data storage device of claim 10, wherein the one or more processors are further configured to apply different weights to outputs of the GAN processors to compensate for noise.

12. The data storage device of claim 10, wherein the plurality of GAN processors are trained differently from one another to adjust for different types of noise.

13. The data storage device of claim 10, wherein the one or more processors are further configured to read a plurality of copies of the data from the NVM using a plurality of different read voltages and to apply respective copies of the data to a corresponding respective GAN processor of the plurality of GAN processors.

14. The data storage device of claim 10, wherein the one or more processors are further configured to combine the results of the GAN processors by determining a median for use as the combined result.

15. The data storage device of claim 10, wherein the one or more processors are further configured to combine the results of the GAN processors by determining an average of the results for use as the combined result while excluding maximum and minimum values.

16. The data storage device of claim 1, wherein the one or more processors are further configured to generate the confidence information using one or more of a rules-based procedure or an inference-based procedure.

17. The data storage device of claim 1, wherein the at least three different reliability values comprise a minimum reliability value, a maximum reliability value, and at least one intermediate reliability value.

18. A method, comprising:
reading pixels representing an image from a non-volatile memory (NVM) of a data storage device;
generating confidence information representative of a confidence in the reliability of the reading of the pixels from the NVM, the confidence information comprising a set of bits that quantify the reliability within a range of reliability values that comprises at least three different reliability values;
modifying the pixels read from the NVM to each include the set of bits that represent the confidence information; and
reconstructing the image with the modified pixels by processing the data using a generative-adversarial-network (GAN) procedure that is configured to reconstruct images comprising pixels that include the set of bits that represent the confidence information.

19. The method of claim 18, further comprising generating the confidence information by:
performing a preliminary reconstruction of the image using a plurality of different GAN procedures without using any confidence information; and
determining whether the plurality of different GAN procedures yielded the same reconstructed image as one another.

20. The method of claim 18, further comprising generating the confidence information by:
performing first and second senses of bits of the data at first and second different read voltages to obtain first and second reads of the data;
identifying a first set of valley bits within the first and second reads of the data; and
generating the confidence information from the set of valley bits.

21. The method of claim 18, wherein the at least three different reliability values comprise a minimum reliability value, a maximum reliability value, and at least one intermediate reliability value.

22. An apparatus for use in a data storage device comprising a data storage controller comprising one or more processors, the apparatus comprising: means for reading pixels representing an image from a non-volatile memory (NVM) of the data storage device; means for generating confidence information representative of a confidence in the reliability of the reading of the pixels from the NVM, the confidence information comprising a set of bits that quantify the reliability within a range of reliability values that comprises at least three different reliability values; means for modifying the pixels read from the NVM to each include the set of bits that represent the confidence information; and means for reconstructing the image with the modified pixels by processing the data using a generative-adversarial-network (GAN) procedure that is configured to reconstruct images comprising pixels that include the set of bits that represent the confidence information.

23. The apparatus of claim 22, wherein the at least three different reliability values comprise a minimum reliability value, a maximum reliability value, and at least one intermediate reliability value.

24. The apparatus of claim 22, further comprising: means for adjusting read voltages based on the confidence information.

* * * * *